(12) United States Patent
Naiki et al.

(10) Patent No.: US 7,687,113 B2
(45) Date of Patent: Mar. 30, 2010

(54) MODIFIED POLYIMIDE RESIN AND CURABLE RESIN COMPOSITION

(75) Inventors: Masahiro Naiki, Yamaguchi (JP); Ryoichi Takasawa, Yamaguchi (JP); Shuichi Maeda, Yamaguchi (JP); Tetsuji Hirano, Yamaguchi (JP); Masayuki Kinouchi, Yamaguchi (JP)

(73) Assignee: Ube Industries, Inc., Ube-shi, Yamaguchi (JP)

( * ) Notice: Subject to any disclaimer, the term of this patent is extended or adjusted under 35 U.S.C. 154(b) by 413 days.

(21) Appl. No.: 11/658,314

(22) PCT Filed: Sep. 9, 2005

(86) PCT No.: PCT/JP2005/017078

§ 371 (c)(1), (2), (4) Date: Jan. 24, 2007

(87) PCT Pub. No.: WO2006/028289

PCT Pub. Date: Mar. 16, 2006

(65) Prior Publication Data

US 2008/0311303 A1    Dec. 18, 2008

(30) Foreign Application Priority Data

Sep. 10, 2004   (JP) .............................. 2004-263343

(51) Int. Cl.
*B05D 3/02*   (2006.01)

(52) U.S. Cl. ................................................. 427/385.5
(58) Field of Classification Search ....................... None
See application file for complete search history.

(56) References Cited

U.S. PATENT DOCUMENTS

| | | | | | |
|---|---|---|---|---|---|
| 4,736,015 | A | * | 4/1988 | Rabilloud et al. | 528/353 |
| 4,996,268 | A | * | 2/1991 | Schoenberg | 525/434 |
| 5,147,943 | A | * | 9/1992 | Inoue et al. | 525/423 |
| 5,254,659 | A | * | 10/1993 | Tajima et al. | 528/45 |
| 6,335,417 | B1 | * | 1/2002 | Orikabe et al. | 528/170 |

OTHER PUBLICATIONS

Abstracts and translation of JP 07-330856, Dec. 1995.*
Translation of JP 48-069079, Sep. 1973.*

* cited by examiner

*Primary Examiner*—Erma Cameron
(74) *Attorney, Agent, or Firm*—Nixon Peabody LLP; Jeffrey L. Costellia

(57) ABSTRACT

A modified polyimide resin favorably employable for manufacturing an insulation film of an electric-electronic device is composed of recurring units (I) derived from a biphenyltetracarboxylic acid compound, a diamine compound, and a monoamine compound having at least one hydroxyl group and recurring units (II) derived from diisocyanate and polybutadiene having hydroxyl group at each terminal, which optionally contains further recurring units (III) derived from diisocyanate and a compound having hydroxyl group at each terminal and further having a reactive substituent.

27 Claims, 8 Drawing Sheets

MODIFIED POLYIMIDE RESIN AND CURABLE RESIN COMPOSITION

FIELD OF THE INVENTION

The present invention relates to a modified polyimide resin and a curable resin composition containing the same. Particularly, the invention relates to a modified polyimide resin which is favorably employable for manufacture of an insulation film (such as a protective film, a solder resist, or an interlayer insulation film) of an electric-electronic device.

BACKGROUND OF THE INVENTION

For manufacturing a protective insulation film of a flexible printed circuit board, polyimide resin, polyurethane resin, polyamideimide resin or epoxy resin is generally employed. These resins are utilized in the form of a curable resin composition, if necessary, after addition of a curable compound.

The protective insulation film preferably has high flexibility, high bendability and low warping property in addition to high heat resistance, high resistance to chemical materials, and high resistance to solvents.

U.S. Pat. No. 6,335,417 B1 describes a modified polyimide resin which can give an article having high heat resistance, good pliability, and low warping property. The modified polyimide resin comprises recurring units composed of polyimide units containing polybutadiene moiety and units of residue derived from diisocyanate.

JP-A-2-191623 describes a thermosetting resin composition comprising a modified imide oligomer having a hydroxyl group at each terminal and an epoxy group-containing compound. The modified imide oligomer is prepared by reacting a biphenyltetracarboxylic acid compound, an aromatic amine compound, and a monoamine compound having at least one hydroxyl group in a solvent.

SUMMARY OF THE INVENTION

It is an object of the present invention to provide a modified polyimide resin which is soluble in organic solvents and can give an insulation film such as a protective film, a solder resist, or an interlayer insulation film of an electric-electronic device, which has high heat resistance, high flexibility, low warping property (or low curling property), good adhesion to molding material, high resistance to chemical materials, high resistance to soldering, and high resistance to solvents.

It is another object of the invention to provide a curable polyimide resin composition which can give an insulation film such as a protective film, a solder resist, or an interlayer insulation film of an electric-electronic device, which has high heat resistance, high flexibility, low warping property (or low curling property), good sealing property, high resistance to chemical materials, high resistance to soldering, and high resistance to solvents.

The present invention resides in a polyimide resin (hereinafter referred to as Polyimide Resin (A)) comprising the following recurring units (I) and (II):

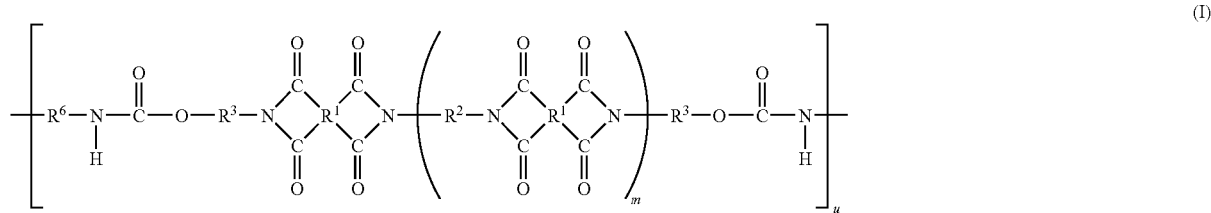

(I)

(II)

in which $R^1$ is a tetravalent residue obtainable by removing all carboxyl groups from an organic compound having 4 carboxyl groups; each of $R^2$ and $R^3$ independently is a divalent hydrocarbon group; $R^4$ is a divalent polybutadiene unit; and $R^6$ is a divalent residue obtainable by removing all isocyanate groups from an organic compound having 2 isocyanate groups; m is an integer of 0 to 20; and each of s and u independently is an integer of 1 to 100.

Polyimide Resin (A) can be prepared by a method which comprises reacting a diisocyanate compound having the formula (1), a polybutadiene compound having the formula (2), and an imide compound having the formula (3):

(1)

(2)

(3)

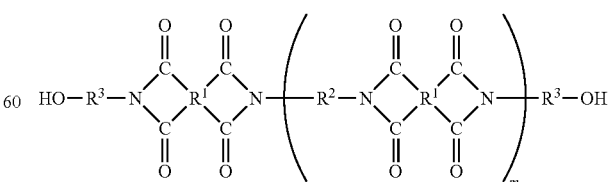

in which each of $R^1$, $R^2$, $R^3$, $R^4$, $R^6$, and mu has the same meaning as above.

The invention further resides in a polyimide resin (hereinafter referred to as Polyimide Resin (B)) comprising the following recurring units (I), (II), and (III):

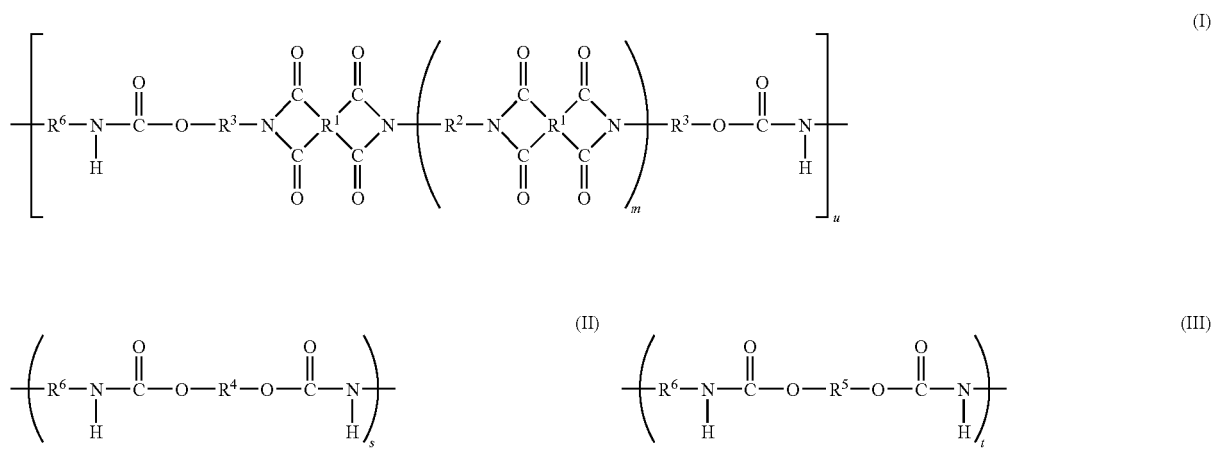

in which $R^1$ is a tetravalent residue obtainable by removing all carboxyl groups from an organic compound having 4 carboxyl groups; each of $R^2$ and $R^3$ independently is a divalent hydrocarbon group; $R^4$ is a divalent polybutadiene unit; and $R^5$ is a divalent hydrocarbon group having a reactive substituent; $R^6$ is a divalent residue obtainable by removing all isocyanate groups from an organic compound having 2 isocyanate groups; m is an integer of 0 to 20; and each of s, t and u independently is an integer of 1 to 100.

Polyimide Resin (B) can be prepared by a method which comprises reacting a diisocyanate compound having the formula (1), a polybutadiene compound having the formula (2), a divalent compound having the formula (4), and an imide compound having the formula (3):

           (1)

           (2)

-continued

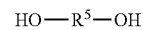           (4)

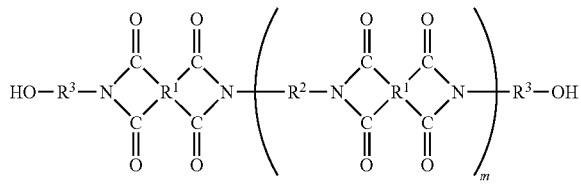           (3)

in which each of $R^1$, $R^2$, $R^3$, $R^4$, $R^5$, $R^6$, and m has the same meaning as above.

Polyimide Resin (B) also can be prepared by a method which comprises reacting a divalent isocyanate compound having the formula (5) and an imide compound having the formula (3):

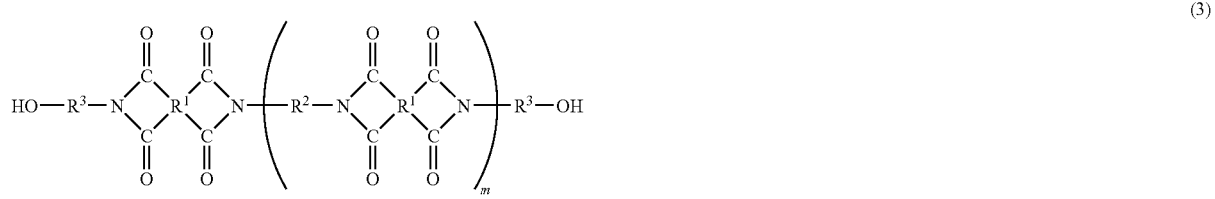           (5)

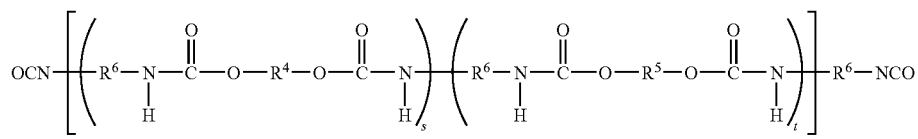           (3)

in which each of $R^1$, $R^2$, $R^3$, $R^4$, $R^5$, $R^6$, m, s, and t has the same meaning as above.

The invention furthermore resides in a curable polyimide resin composition comprising 100 weight parts of at least one polyimide resin selected from the group consisting of Polyimide (A) and Polyimide (B), 1 to 50 weight parts of an epoxy group, and an organic solvent.

The invention furthermore resides in a process for preparing a cured resin film which comprises the steps of coating a curable polyimide resin composition of the invention on a substrate and heating the coated composition.

The invention furthermore resides in an imide oligomer having the following formula (3):

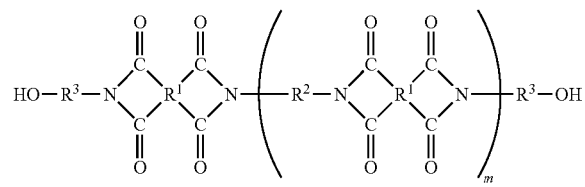

in which $R^1$ is a tetravalent residue obtainable by removing all carboxyl groups from an organic compound having 4 carboxyl groups; $R^2$ is a divalent alicyclic hydrocarbon group having 4 to 20 carbon atoms; $R^3$ is a divalent aliphatic hydrocarbon group having 1 to 10 carbon atoms; and m is an integer of 0 to 20.

DETAILED DESCRIPTION OF THE INVENTION

Figure 1:
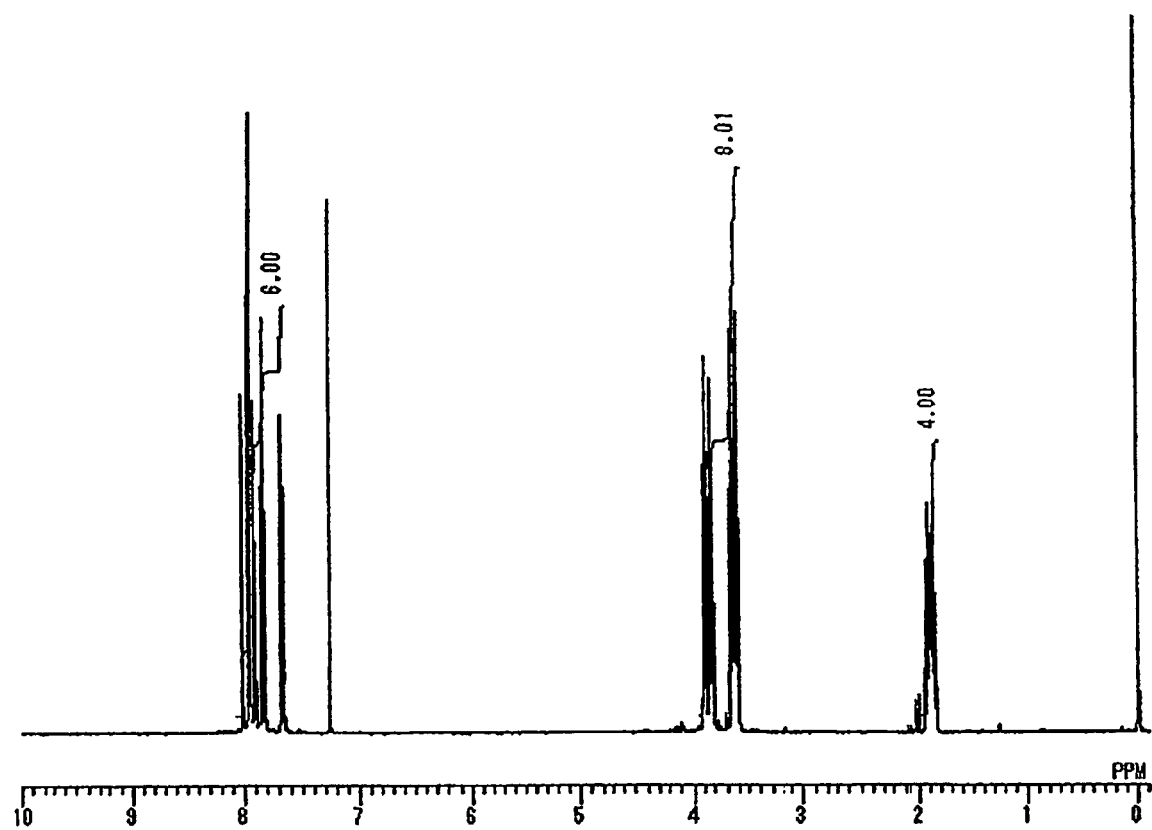
FIG. 1 is $^1$H-NMR spectrum of imide compound (a) having hydroxyl group at each terminal which was obtained in Synthesis Example 1.

Polyimide Resin (A) of the invention can be prepared by reacting a diisocyanate compound having the formula (1), a polybutadiene compound having the formula (2), and an imide compound having the formula (3):

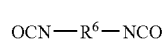
(1)

(2)

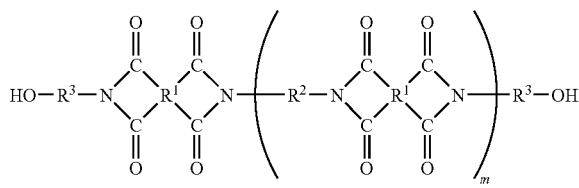
(3)

in which each of $R^1$, $R^2$, $R^3$, $R^4$, $R^6$, m, s, and u has the same meaning as above.

The reaction can be carried out in an organic solvent or in the absence of a solvent in an inert gas atmosphere such as nitrogen gas at a temperature in the range of 30 to 150° C., preferably 30 to 120° C., for 1 to 10 hours.

The diisocyanate compound of the formula (1) can be any diisocyanate such as an aliphatic diisocyanate, an alicyclic diisocyanate or an aromatic diisocyanate. The diisocyanate preferably contains 2 to 30 carbon atoms excluding carbon atoms contained in the isocyanate groups. Examples of the diisocyanate compounds include 1,4-tetramethylene diisocyanate, 1,5-pentamethylene diisocyanate, 1,6-hexamethylene diisocyanate, 2,2,4-trimethyl-1,6-hexamethylene diisocyanate, lysine diisocyanate, 3-isocyanate methyl-3,5,5-trimethylcyclohexylisocyanate (i.e., isophorone diisocyanate), 1,3-bis(isocyanate methyl)cyclohexane, 4,4'-dicyclohexylmethane diisocyanate, tolylene diisocyanate, 4,4'-diphenylmethane diisocyanate, 1,5-naphthalene diisocyanate, tolidine diisocyanate, and xylylene diisocyanate.

The diisocyanate compound can be a blocked diisocyanate which is blocked with a blocking agent at the isocyanate group.

The blocking agent can be an alcohol compound, a phenol compound, an active methylene compound, a mercaptan compound, an acid-amide compound, an acid-imide compound, an imidazole compound, a urea compound, an oxime compound, an amine compound, an imine compound, hydrogensulfite, or a pyridine compound. These compounds can be employed singly or in combination. Examples of the blocking agents include alcohol compounds such as methanol, ethanol, propanol, butanol, 2-ethylhexanol, methyl cellosolve, butyl cellosolve, methylcarbitol, benzyl alcohol, cyclohexanol; phenol compounds such as phenol, cresol, ethylphenol, butylphenol, nonylphenol, dinonylphenol, phenol modified with styrene, and hydroxybenzoic esters; active methylene compounds such as dimethyl malonate, diethyl malonate, methyl acetoacetate, ethyl acetoacetate, and acetylacetone; mercaptan compounds such as butylmercaptan and dodecylmercaptan; acid-amide compounds such as acetanilide, acetamide, ∈-caprolactam, δ-valerolactam, and γ-butyrolactam; acid-imide compounds such as succinic imide and maleic imide; imidazole compounds such as imidazole and 2-methylimidazole; urea compounds such as urea, thiourea, and ethyleneurea; oxime compounds such as formaldoxime, acetaldoxime, acetoxime, methyl ethyl ketoxime, and cyclohexanone oxime; amine compounds such as diphenylamine, aniline, and carbazole; imine compounds such as ethyleneimine and polyethyleneimine; hydrogensulfites such as sodium hydrogensulfite; and pyridine compounds such as 2-hydroxypyridine and 2-hydroxyquinoline.

The polybutadiene compound of the formula (2) has a molecular weight preferably in the range of 500 to 10,000, more preferably in the range of 1,000 to 5,000. The polybutadiene compound may contain double bonds in its molecular structure. Otherwise, the polybutadiene compound may have no double bonds which is obtained by hydrogenation. The polybutadiene compound containing no double bonds is preferred. Examples of the preferred polybutadiene compounds include GI-1000, GI-2000 (both available from Nihon Soda Co., Ltd.), R-45EPI (available from Idemitsu Petrochemical Co., Ltd.), and POlYTER H (available from Mitsubishi Chemical Co., Ltd.).

The imide compound of the formula (3) can be prepared by reacting a tetracarboxylic acid compound, a diamine compound, and a monoamine compound having one hydroxyl group.

The tetracarboxylic acid compound preferably is an aromatic tetracarboxylic acid or an alicyclic tetracarboxylic acid, an acid dianhydride thereof, or an ester with a lower alcohol. Examples of the aromatic tetracarboxylic acids include 2,3,3',4'-biphenyltetracarboxylic acid, 3,3',4,4'-biphenyltetracarboxylic acid, 2,2',3,3'-biphenyltetracarboxylic acid, 3,3',4,4'-diphenylethertetracarboxylic acid, 3,3',4,4'-diphenylsulfonetetracarboxylic acid, 3,3',4,4'-benzophenonetetracarboxylic acid, 2,2-bis(3,4-benzenedicarboxylic acid)hexafluoropropane, pyromellitic acid, 1,4-bis(3,4-benzenedicarboxylic acid)benzene, 2,2-bis[4-(3,4-phenoxydicarboxylic acid)phenyl]propane, 2,3,6,7-naphthalenetetracarboxylic acid, 1,2,5,6-naphthalenetetracarboxylic acid, 1,2,4,5-naphthalenetetracarboxylic acid, 1,4,5,8-naphthalenetetracarboxylic acid, and 1,1-bis(2,3-dicarboxyphenyl)ethane. Examples of the alicyclic tetracarboxylic acids include cyclopentanetetracarboxylic acid, 1,2,4,5-cyclohexanetetracarboxylic acid, and 3-methyl-4-cyclohexene-1,2,4,5-tetracarboxylic acid. More preferably, the tetracarboxylic acid is 2,3,3',4'-biphenyltetracarboxylic acid, 3,3',4,4'-diphenylethertetracarboxylic acid, 2,2',3,3'-biphenyltetracarboxylic acid, and acid dianhydrides thereof, and esters thereof with a lower alcohol. The acid dianhydrides are most favorably employed.

The diamine compound can be a diamine compound of any type. Aromatic, alicyclic, or aliphatic diamine can be employed. Examples of the aromatic diamines include aromatic diamines having one benzene ring, such as 1,4-diaminobenzene, 1,3-diaminobenzene, 2,4-diaminotoluene, 1,4-diamino-2,5-dihalogenobenzene; aromatic diamines having two benzene rings, such as bis(4-aminophenyl)ether, bis(3-aminophenyl)ether, bis(3-aminophenyl)sulfone, bis(4-aminophenyl)methane, bis(3-aminophenyl)methane, bis(4-aminophenyl)sulfide, bis(3-aminophenyl)sulfide, 2,2-bis(4-aminophenyl)propane, 2,2-bis(3-aminophenyl)propane, 2,2-bis(4-aminophenyl)hexafluoropropane, o-dianisidine, o-tolidine, and tolidinesulfonic acid; aromatic diamines having three benzene rings, such as 1,4-bis(4-aminophenoxy)benzene, 1,4-bis(3-aminophenoxy)benzene, 1,4-bis(4-aminophenyl)benzene, 1,4-bis(3-aminophenyl)benzene, α,α'-bis(4-aminophenyl)-1,4-diisopropylbenzene, and α,α'-bis(4-aminophenyl)-1,3-diisopropylbenzene; and aromatic diamines having four benzene rings, such as 2,2-bis[4-(4-aminophenoxy)phenyl]propane, 2,2-bis[4-(4-aminophenoxy)phenyl]hexafluoropropane, 2,2-bis-[4-(4-aminophenoxy)phenyl]sulfone, 4,4'-(4-aminophenoxy)biphenyl, 9,9-bis(4-aminophenyl)fluorene, and 5,10-bis(4-aminophenyl)anthracene. Examples of the alicyclic diamines include isophorone diamine, norbornene diamine, 1,2-diaminocyclohexane, 1,3-diaminocyclohexane, 1,4-diaminocyclohexane, bis(4-aminocyclohexyl)methane, and bis(4-aminocyclohexyl)methane. Examples of the aliphatic diamines include hexamethylene diamine and diaminododecane.

The alicyclic diamine is preferred because the resulting modified polyimide resin is well soluble in solvents, shows high heat resistance, and shows good adhesion to other materials. The alicyclic diamine preferably has 4 to 20 carbon atoms.

The monoamine compound having one hydroxyl group is a compound containing one amino group and one hydroxyl group in its molecular structure. Examples are aliphatic monoamine having 1 to 10 carbon atoms and one hydroxyl group, such as aminoethanol, aminopropanol, and aminobutanol; alicyclic monoamine having 3 to 20 carbon atoms and one hydroxyl group, such as aminocyclohexanol; and aromatic monoamine having 6 to 20 carbon atoms and one hydroxyl group, such as aminophenol, aminocresol, 4-hydroxy-4'-aminodiphenyl ether, 4-hydroxy-4'-aminobiphenyl, aminobenzyl alcohol, and aminophenethyl alcohol.

The reaction for preparing the imide compound of the formula (3) can be conducted by reacting the tetracarboxylic acid compound, the diamine compound, and the monoamine compound having one hydroxyl group in an organic solvent to perform polymerization and imidation. The amine compounds (including the diamine compound and monoamine compound having one hydroxyl group) are used in a molar amount essentially equivalent to a molar amount of the acid anhydride group (or the amount of adjoining two carboxylic group) of the tetracarboxylic acid compound. The reaction is carried out at a temperature of approx. 100° C. or lower, preferably 80° C. or lower, to produce an compound having an amide-acid bonding which has hydroxyl group at each terminal, and the reaction is further continued at a low temperature of approx. 0° C. to 140° C. after addition of an imidation-promoting agent, or at a high temperature of 140° C. to 250° C., so that dehydration-imidation reaction proceeds to produce an imide compound having hydroxyl group at each terminal. In the course of the dehydration-imidation reaction, the water produced by condensation reaction can be removed by azeotropic distillation with toluene or xylene.

Examples of the organic solvents employable for the production of the imide compound having hydroxyl group at each terminal include amide solvents such as N,N-dimethylformamide, N,N-dimethylacetamide, N-methyl-2-pyrrolidone, and N-methylcaprolactam; sulfur-containing solvents such as dimethyl sulfoxide, hexamethylphosforamide, dimethyl sulfone, tetramethylene sulfone, and dimethyltetramethylene sulfone; phenolic solvents such as cresol, phenol, and xylenol; diglyme solvents such as diethylene glycol dimethyl ether (diglyme), triethylene glycol dimethyl ether (triglyme), and tetraglyme; ketone solvents such as isophorone, cyclohexanone, and 3,3,5-trimethylcyclohexanone; and other organic solvents such as pyridine, ethylene glycol, dioxane, and tetramethylurea. An aromatic hydrocarbon solvent such as benzene, toluene, or xylene can be also employed. The organic solvents can be employed singly or in combination.

The produced imide compound having hydroxyl group at each terminal can be a monomer (in which m of the formula (3) is 0) or an oligomer (in which m of the formula (3) is 1 or more), depending on the molar ratio of the monoamine compound to the diamine compound introduced into the reaction system. The product can be a mixture of the monomer and oligomer, or a mixture of plural oligomers. The mixture can be employed as such or after isolation of the monomer or each oligomer, for manufacturing the desired polyimide resin.

The imide compound having hydroxyl group at each terminal produced in an organic solvent can be employed as such for manufacturing the desired polyimide resin. Otherwise, the imide compound solution can be concentrated or diluted for manufacturing the desired polyimide resin. Otherwise, the imide compound can be isolated from the solution, for example, by incorporating a non-solvent such as water into the imide compound solution. The imide compound can be dried. The dry imide compound can be again dissolved in an appropriate organic polar solvent to give an imide compound solution.

Polyimide Resin (B) of the invention can be prepared by reacting a diisocyanate compound having the formula (1), a polybutadiene compound having the formula (2), a divalent compound having the formula (4), and an imide compound having the formula (3) in a manner essentially the same as that for the preparation of Polyimide Resin (A).

Polyimide Resin (B) differs from Polyimide Resin (A) in the constitution that the former contains units derived from the divalent compound of the formula (4).

ing compound and the imide compound to a molar amount of the diisocyanate compound is preferably in the range of 0.5 to 2.5, more preferably 0.8 to 2.5. A molar ratio of the divalent compound of the formula (4) to the polybutadiene compound of the formula (2) is preferably 10 or lower, more preferably 5 or lower.

The reaction for preparing Polyimide Resin (A) or (B) can be carried out by simultaneously dissolving all of the reactive compounds in an organic solvent. However, it is preferable that the diisocyanate compound first reacts with the two hydroxyl group-containing compound (i.e., the polybutadiene compound alone, or the combination of the polybutadiene compound and divalent compound) in an organic solvent to produce a divalent isocyanate compound having the formula (5):

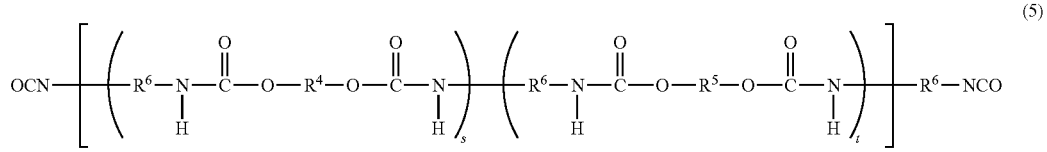

The divalent compound of the formula (4) is characteristic in that it contains a reactive substituent that is a polar substituent reactive with an epoxy group or an isocyanate group. If the polyimide resin containing such a reactive substituent in the molecular structure is used in combination with a curing agent such as an epoxy compound or an isocyanate compound in the curable polyimide composition, the reactive substituent reacts with the epoxy or isocyanate compound to efficiently form a cross-linked structure in the resulting cured polyimide composition. Therefore, the resulting cured polyimide composition shows improved heat-resistance and solvent-resistance.

The reactive substituent preferably is an active hydrogen-containing group such as a carboxyl group or a phenolic hydroxyl group.

Preferably, the divalent compound of the formula (4) is a diol compound containing 1 to 30 carbon atoms, more preferably 2 to 20 carbon atoms, and the reactive substituent such as a carboxyl group or a phenolic hydroxyl group. Examples of the diol compounds containing a carboxyl. group include 2,2-bis(hydroxymethyl)propionic acid and 2,2-bis(hydroxymethyl)butyric acid. Examples of the diol compound containing a phenolic hydroxyl group include 2,6-bis(hydroxymethyl)phenol and 2,6-bis(hydroxymethyl)-p-cresol.

In the preparation of the polyimide resin, a ratio of the number of total hydroxyl groups of the two hydroxyl group-containing compound (i.e., the polybutadiene compound alone, or the combination of the polybutadiene compound and divalent compound) and the imide compound to the number of isocyanate groups of the diisocyanate compound, in other words, a ratio of molar amounts of the two hydroxyl group-containing compound and the imide compound to a molar amount of the diisocyanate compound, is preferably in the range of 0.5 to 3.0, more preferably in the range of 0.8 to 2.5, most preferably in the range of 0.9 to 2.0. A ratio of a molar amount of the two hydroxyl group-containing compound to a molar amount of the imide compound is generally in the range of 100 to 0.01, preferably in the range of 10 to 0.1.

If the two hydroxyl group-containing compound comprises the polybutadiene compound and divalent compound, a ratio of a molar amount of the two hydroxyl group-containin which each of $R^4$, $R^5$, $R^6$, s and t has the same meaning as hereinbefore.

The formula (5) should not be construed to indicate that the left polybutadiene ($R^4$)-containing unit and the right divalent compound ($R^5$)-containing unit are necessarily combined to give a block structure. The left polybutadiene ($R^4$)-containing units and the right divalent compound ($R^5$)-containing units can be combined at random to give a random copolymerization structure.

The divalent isocyanate compound of the formula (5) is then reacted with the imide compound of the formula (3) to produce the desired Polyimide Resin (A) or (B).

The resulting modified polyimide resin has a number-average molecular weight of preferably 3,000 to 50,000, more preferably 4,000 to 40,000, most preferably 4,000 to 30,000.

Examples of the organic solvents employed for the preparation of the modified polyimide resin (i.e., Polyimide Resin (A) or (B)) are the same as those employable for the production of the imide compound having hydroxyl group at each terminal.

The organic solvent is employed generally in an amount of 30 to 500 weight parts, preferably 60 to 200 weight parts, per 100 weight parts of the imide compound having hydroxy group at each terminal.

The resulting modified polyimide resin is present in an organic solvent at a concentration of preferably 3 wt. % or higher, more preferably 5 to 50 wt. %. The polyimide resin solution shows a viscosity (at 25° C., measured by E type rotary viscometer) of preferably 1 to 10,000 poises, more preferably 1 to 400 poises.

The modified polyimide resin of the invention, i.e., Polyimide Resin (A) and Polyimide Resin (B), can be mixed with an epoxy compound and an organic solvent to give a curable polyimide resin composition of the invention. The epoxy compound is employed in an amount of preferably 1 to 50 weight parts, more preferably 2 to 40 weight parts, most preferably 5 to 35 weight parts, per 100 weight parts of the modified polyimide resin. The curable polyimide resin composition of the invention can further contain 1 to 50 weight parts (per 100 weight parts of the modified polyimide resin) of a blocked polyvalent isocyanate compound. The curable polyimide resin composition of the invention can furthermore contain 1 to 20 weight parts, preferably 1 to 15 weight parts, more preferably 1 to 10 weight parts (per 100 weight parts of the modified polyimide resin) of a polycarbonate compound having a hydroxyl group at each terminal. The incorporation of the polycarbonate compound is effective to impart to the resulting composition increased adhesion to the molding materials (or sealing materials) employed in the manufacture of an electric-electronic device. The curable polyimide resin composition of the invention can furthermore contain 0.1 to 18 weight parts, preferably 0.3 to 15 weight parts, more preferably 0.5 to 10 weight parts (per 100 weight parts of the modified polyimide resin) of a compound having two or more phenolic hydroxyl groups. The incorporation of the compound having two or more phenolic hydroxyl groups is effective to impart to the resulting composition increased adhesion to the anisotropic conductive material employed in the manufacture of an electric-electronic device.

The epoxy compound preferably is a liquid or solid epoxy resin having an epoxy equivalent in the range of 100 to 4,000 and a molecular weight in the range of 300 to 10,000. Examples of the epoxy compounds employable in the invention include epoxy resins of Bisphenol A type or Bisphenol F type, such as Epikote 806, Epikote 825, Epikote 828, Epikote 1001, Epikote 1002, Epikote 1003, Epikote 1004, Epikote 1055, Epikote 1004AF, Epikote 1007, Epikote 1009, and Epikote 1010 (all available from Japan Epoxy Resin Co., Ltd.); epoxy resins having three or more functional groups, such as Epikote 152, Epikote 154, Epikote 180 series, Epikote 157 series, Epikote 1032 series (all available from Japan Epoxy Resin Co., Ltd.); SUMIEPOXY ELM 100 (available from Sumitomo Chemical Industry Co., Ltd.), EHPE 3150 (available from Daicel Company, Ltd.), and MTO0163 (available from Ciba-Geigy); terminal epoxied oligomer, such as HICAR ETBN 1300×40 (available from Ube Industries, Ltd.), and DENALEX R-45EPT (available from Nagase Chemtech Co., Ltd.); epoxied polybutadiene, such as POLYBUTADIENE E-1000-8, E-1800-6.5 (available from Nippon Petrochemical Co., Ltd.) and EPOLEAD PB3600 (available from Daicel Company, Ltd.).

Examples of the blocked polyvalent isocyanate compounds include BARNOCK D-500 (blocked tolylene diisocyanate), BARNOCK D-550 (blocked 1,6-hexamethylene diisocyanate), both available from Dai-Nippon Ink and Chemical Industry Co., Ltd., TAKENATE B-830 (blocked tolylene diisocyanate), TAKENATE B-815N (blocked 4,4'-methylenebis(cyclohexylisocyanate)), TAKENATE B-842N (blocked 1,3-bis(isocyanatemethyl)cyclohexane), TAKENATE B-846N (blocked 1,3-bis(isocyanatemethyl)cyclohexane), TAKENATE 847N (blocked isophorone diisocyanate), TAKENATE B-882N (blocked 1,6-hexamethylene diisocyanate), all available from Mitsui-Takeda Chemical Co., Ltd., DURANATE MF-B60X (blocked 1,6-hexamethylene diisocyanate), DURANATE MFK60X (blocked 1,6-hexamethylene diisocyanate), both available from Asahi Kasei Co., Ltd., ELASTRON BN-P17 (blocked 4,4'-diphenylmethane diisocyanate), ELASTRON BN-04, ELASTRON BN-08, ELASTRON BN-44, ELASTRON BN-45 (all are blocked urethane-modified polyisocyanates having 3 to 5 functional groups), all available in the form of an aqueous emulsion (the blocked urethane-modified polyisocyanate can be isolated as a dry powder from the aqueous emulsion) from Dai-ichi Kogyo Seiyaku Co., Ltd.

The polycarbonate compound having a hydroxyl group at each terminal has a molecular weight in the range of preferably 500 to 10,000, more preferably 500 to 5,000. Examples of the polycarbonate compounds having a hydroxyl group at each terminal include ENATACOL UH-CARB, UN-CARB, UD-CARB, UC-CARB, all available from Ube Industries, Ltd., PLACCEL CD-PL, PLACCEL CH-H, both available from Daicel Company, Ltd., and Kuraray Polyol C available from Kuraray Co., Ltd. The polycarbonate compounds having a hydroxyl group at each terminal can be employed singly or in combination Examples of the compounds having two or more phenolic hydroxyl groups include hydroquinone, 4,4'-dihydroxybiphenyl, and phenol resins such as phenol-novolak and cresol-novolak. Examples of the phenol resins include Phenol-novolak resins H-1, H-2, H-3, H-4, and H-5, Orthocresol-novolak resins MER-130 and MEH-7500 of triphenol methane type, MET-7600 of tetrakisphenol type, MEH-7700 of naphthol type, MEH-7800 and MEH-7851 of phenolaralkyl type, R-3 of triphenol type, and MEP-6039 and MEP 6309E of bisphenol-novolak type, and MEH-8000H, MEH-8005, MEH-8010, MEH-8015, and MEH-82085 of liquid phenol-novolak type. These phenol resins are available from Meiwa Plastic Industries, Ltd.

The polyimide resin composition of the invention preferably contains further a curing agent (i.e., curing catalyst) for promoting cross-linking between the polyimide resin and the epoxy compound or blocked polyvalent isocyanate compound. The curing agent is included preferably in an amount of 0.01 to 25 weight parts, more preferably 0.1 to 15 weight parts, per 100 weight parts of the epoxy compound or blocked polyvalent isocyanate compound. The curing agent can be one of imidazole compounds or tertiary amine compounds. Examples of the imidazole compounds include 2-methylimidazole, 2-ethyl-4-methylimidazole, 2-phenylimidazole, and 2-phenyl-4-methylimidazole. Examples of the tertiary amine compounds include 1,8-diazabicyclo[5.4.0]-7-undecene (referred to as DBU), N,N-dimethylbenzylamine, N,N,N',N'-tetramethylhexanediamine, triethylenediamine (TEDA), 2-dimethylaminomethylphenol (DMP-10), 2,4,6-tris(dimethylaminomethyl)phenol (DMP-30), dimorpholino diethyl ether (DMDEE), 1,4-dimethylpiperazine, and cyclohexyldimethylamine.

Examples of the solvents constituting the polyimide resin composition of the invention can be those employed in the method for producing the modified polyimide resin. Preferred examples include nitrogen atom-containing solvents such as N,N-dimethylacetamide, N,N-diethylacetamide, N,N-dimethylformamide, N,N-diethylformamide, N-methyl-2-pyrrolidone, 1,3-dimethyl-2-imidazolidinone, and N-methylcaprolactam; sulfur atom-containing solvents such as dimethyl sulfoxide, diethyl sulfoxide, dimethyl sulfone, diethyl sulfone, and hexamethyl sulforamide; oxygen atom-containing solvents including phenolic solvents such as cresol, phenol, and xylenol, diglyme solvents such as diethylene glycol dimethyl ether (diglyme), triethylene glycol dimethyl ether (triglyme), and tetraglyme, ketone solvents such as acetone, acetophenone, propiophenone, cyclohexanone, and isophorone, ether solvents such as ethylene glycol, dioxane, and tetrahydrofuran, and lactone solvents such as γ-butyrolactone. Most preferred are N-methyl-2-pyrrolidone, dimethyl sulfoxide, N,N-dimethylformamide, N,N-diethylformamide, N,N-dimethylacetamide, N,N-diethylacetamide, γ-butyrolactone, triethylene glycol dimethyl ether (triglyme), and isophorone.

The organic solvent has a boiling point preferably in the range of 140 to 220° C., more preferably higher than 180° C., most preferably higher than 200° C.

Examples of the preferred organic solvents include triglyme (b.p. 216° C.), γ-butyrolactone (b.p. 204° C.), and isophorone (b.p. 213° C.). The organic solvents of the above-mentioned boiling point range shows little volatility so that the screen printing of the solution composition (i.e., ink composition) can be easily carried out. Most preferred is isophorone, because the polybutadiene compound having a hydroxyl group at each terminal (i.e., the polybutadiene compound of the formula (2)) and the imide compound having a hydroxyl group at each terminal (i.e., the imide compound of the formula (3)) are easily soluble in isophorone. Further, a polyimide composition solution using isophorone as the solvent can be conveniently employed for screen-printing because isophorone absorbs little water and shows a high boiling point and low volatility.

The polyimide resin composition of the invention preferably contains further a fine filler. The fine filler has an average diameter preferably in the range of 0.001 to 15 µm, more preferably 0.005 to 10 µm. Examples of the fine fillers include inorganic fine fillers such as silica micro powder, talc, barium sulfate, and mica, and organic fine fillers such as cross-linked NBR fine powder.

The fine filler is employed in an amount of 5 to 150 weight parts, preferably 10 to 125 weight parts, per 100 weight parts of the modified polyimide resin. The inorganic filler is preferred. Particularly preferred is a combination of silica micro powder with talc, mica, or barium sulfate. In this case, 1 to 50 weight parts, preferably 5 to 40 weight parts, of the silica micro powder and 5 to 130 weight parts of at least one of talc, mica, and barium sulfate are used per 100 weight parts of the modified polyimide resin. The addition of the fine fillers in such manner is particularly effective to impart good printability and insulation characteristics to the resulting insulation film.

The polyimide resin composition of the invention can further contain 0.1 to 100 weight parts of a pigment such as a colored organic pigment or a colored inorganic pigment, per 100 weight parts of the modified polyimide resin.

The polyimide resin composition of the invention can further contain an anti-foaming agent in an amount of 0.1 to 10 weight parts per 100 weight parts of the modified polyimide resin.

The polyimide resin composition is in the form of a solution composition. The solution composition can be easily prepared by mixing the modified polyimide resin, epoxy compound, and other optional additives in an organic solvent. Otherwise, the epoxy compound and other optional additives can be incorporated into the reaction solution in which the produced polyimide resin is already present. The reaction solution can be employed as such, or after dilution by adding an appropriate organic solvent.

The solution composition (i.e., polyimide resin composition) of the invention has a solution viscosity in the range of generally 50 to 10,000 poises (at 25° C.), preferably 100 to 1,000 poises, more preferably 100 to 600 poises, because the solution composition having a solution viscosity in the above-mentioned range can be conveniently employed as an ink composition for the use in screen printing and can give a cured insulation film having good characteristics.

The polyimide resin composition of the invention can be favorably employed for the formation of an insulation film (i.e., protection film) on an electric-electronic device on which chip elements such as IC chips are mounted.

For instance, the polyimide resin composition is coated on a surface of an electro-conductive metal film having a wiring pattern arranged on an insulation sheet to form a resin composition layer of 3 to 60 µm thick (thickness after dryness) by screen printing. Thus formed resin composition layer is then heated at 50 to 100° C. for 5 to 60 minutes for removing the solvent and subsequently heated at 100 to 210° C., preferably 110 to 200° C., for 5 to 120 minutes, preferably 10 to 60 minutes for curing the resin composition, so that a cured polyimide resin composition film (i.e., insulation film) having a modulus of elasticity in the range of 10 to 500 MPa can be produced. Thus produced insulation film shows high flexibility, high bendability, high heat-resistance, high resistance to warping, high resistance to soldering, high resistance to chemical materials, high resistance to solvents (e.g., acetone, isopropanol, methyl ethyl ketone, and N-methyl-2-pyrrolidone), good adhesion to an electroconductive metal, a substrate and a molding material, and good electric characteristics.

It also is advantageous that the polyimide resin composition of the invention can be cured at a relatively low temperature such as in the range of 50 to 210° C., particularly 60 to 160° C., to give an insulation film having satisfactory characteristics. Accordingly, the polyimide resin composition of the invention can be utilized as an interlayer adhesive to combine adjoining substrates of multi-layered wiring board.

The present invention is further described by the following examples.

In the following examples, the physical data and other properties were determined by the below-mentioned methods.

[$^1$H-NMR Spectrum]

The $^1$H-NMR spectrum was obtained in a deuterated dimethyl sulfoxide or a deuterated chloroform by means of a nuclear magnetic spectrometer (AL-300, available from JEOL, Ltd.).

[Solution Viscosity]

The solution viscosity was determined at 25° C. and 10 rpm (rotation) by means of a viscometer Tv-20 (available from Tohki Sangyo Co., Ltd.).

[GPC]

The number-average molecular weight was determined in tetrahydrofuran by means of LC-10 (GPC column KF-80Mx2, Kf-802, available from Shimazu Seisakusho Co., Ltd.). The polystyrene standard was used.

[Modulus in Tension]

A polyimide resin composition was cured to give a cured sheet having a thickness of approx. 100 µm. The cured sheet was cut to give a test piece (width: 1 cm, length: 7 cm). The test piece was subjected to the measurement of modulus in tension at 25° C., 50% RH, and at a cross-head speed of 50 mm/min., and a space between chucks of 5 cm.

The curing of the polyimide resin composition was carried out by the following heating steps:

For Examples 6-20 and Comparison Example 1:

The resin composition was first heated at 80° C. for 30 min., and then heated at 150° C. for 90 min.

For Examples 21-22:

The resin composition was first heated at 80° C. for 30 min., and then heated at 120° C. for 90 min.

[Evaluation of Cured Insulation Film]

The polyimide resin composition was coated on a glossy surface of an electrolytic copper film (thickness: 35 µm) to give a coated layer of approx. 50 µm. The coated polyimide resin composition layer was heated for curing to give a cured insulation film of approx. 20 µm thick.

The curing of the polyimide resin composition was carried out by the following heating steps:

For Examples 6-20 and Comparison Example 1:

The resin composition was first heated at 80° C. for 30 min., and then heated at 150° C. for 90 min.

For Examples 21-22:

The resin composition was first heated at 80° C. for 30 min., and then heated at 120° C. for 90 min.

The cured insulation film was then subjected to the tests for bendability, adhesion to molding material, resistance to soldering, and resistance to solvents, according to the below-mentioned methods.

[Bendability]

The cured insulation film was reversely bent and the bent area was observed. If no change was observed, "pass" was marked. If there were cracks in the bent area, "failure" was marked.

[Adhesion to Molding Compound]

An IC chip molding material CEL-C-5020 (available from Hitachi Chemical Co., Ltd.) was dropped on the cured insulation film to give a circular layer (thickness: approx. 1 mm, diameter: approx. 0.5 cm). The circular layer was then heated to 150° C. for one hour for curing.

The test sample having the cured molding material layer was manually bent and observed to examine if any separations occurred in the constitutional layers. If the separation occurred in the insulation film due to cohesive failure or between the copper film and the insulation film, "pass" was marked. If the separation occurred between the insulation film and the layer of molding material, "failure" was marked. A test sample in which the area of "pass" is higher than 70%, "good" was marked, while a test sample in which the area of "pass" is in the range of 30 to 70%, "poor" was marked.

[Resistance to Soldering]

A rosin wax (SUNFLUX SF-270, available from Sanwa Chemical Industry Co., Ltd.) was coated on the cured insulation film. The coated insulation film was then brought into contact with a soldering bath (heated to 260° C.) for 10 seconds. Thus treated insulation film was observed. If no change was observed on the insulation film, "good" was marked. If certain coarse surface was observed on the insulation film, "pass" was marked. If the insulation film was melted or deformed, "failure" was marked.

[Resistance to Solvents]

The insulation film on the copper film was immersed in acetone at 25° C. for one hour, and the free surface of the insulation film was rubbed with a cotton bar applicator in which acetone was absorbed, under the conditions of a load of 300 to 500 g and a rubbing angle of 45°, until the copper surface was exposed. The number of the rubbing until the copper surface was exposed was recorded.

[Insulation Property in Terms of Volume Resistance]

A cured insulation film was prepared by heat treatment at 80° C. for 30 min., and then at 150° C. for 60 min. The cured insulation film was then measured in its volume resistance according to JIS C-2103.

The compounds, epoxy resins, curing agent and additives employed in the examples are described below.

[Tetracarboxylic Acid Compound]
2,3,3',4'-biphenyltetracarboxylic dianhydride

[Diamine Compound]
2,4-diaminotoluene
isophorone diamine,

[Amino Alcohol]
3-aminopropanol

[Diol Having a Reactive Polar Substituent]
2,2-bis(hydroxymethyl)propionic acid

[Polybutadiene Having a Hydroxyl Group at Each Terminal]
hydrogenated polybutadiene polyol GI-1000 (hydroxyl value: 68.72 KOHmg/g, available from Nihon Soda Co., Ltd.)
hydrogenated polybutadiene polyol GI-2000 (hydroxyl value: 46.2 KOHmg/g, available from Nihon Soda Co., Ltd.)

[Diisocyanate Compound]
4,4'-diphenylmethane diisocyanate

[Solvent]
dimethylacetamide
toluene
cyclohexanone
isophorone
γ-butyrolactone

[Epoxy Resin]
Epikote 157S70 (epoxy equivalent: 200 to 220, available from Japan Epoxy Resin Co., Ltd.)
Epikote 828EL (epoxy equivalent: 184 to 194, available from Japan Epoxy Resin Co., Ltd.)
EPOLEAD PB3600 (epoxy equivalent: 194, available from Daicel Company, Ltd.)
EHPE 3150 (epoxy equivalent; 156, available from Daicel Company, Ltd.)
Nisseki Polybutadiene E-1000-8 (epoxy equivalent: 200, available from Shin-Nihon Petrochemical Co., Ltd.)
SUMIEPOXY ELM100 (epoxy equivalent: 97, available from Sumitomo Chemical Industry, Co., Ltd.)

[Blocked Polyisocyanate Compound]
BARNOCK D-550 (blocked 1,6-hexamethylene diisocyanate, blocking agent: methyl ethyl ketoxime, available from Dai-Nippon Ink and Chemical Co., Ltd.)

[Polycarbonate Having Hydroxyl Group at Each Terminal]
ENATACOL UH-CARB200 (average molecular weight: 2,000, available from Ube Industries, Ltd.)
KURARAY POLYOL C-2015 (average molecular weight: 2,000, available from Kuraray Co., Ltd.)

[Compound Having Phenolic Hydroxyl-Group]
H-1 (phenol-novolak, available from Meiwa Plastic Industries, Ltd.)
H-3 (phenol-novolak, available from Meiwa Plastic Industries, Ltd.)

[Curing Agent]
2-ethyl-4-methylimidazole

[Silica Micro Powder]
Aerogil 130 (BET surface area: 130 $m^2$/g, available from Japan Aerogil Co., Ltd.)
Aerogil R972 (BET surface area: 110 $m^2$/g, available from Japan Aerogil Co., Ltd.)
Aerogil R974 (BET surface area: 170 $m^2$/g, available from Japan Aerogil Co., Ltd.)
Aerogil R805 (BET surface area: 150 $m^2$/g, available from Japan Aerogil Co., Ltd.)
Aerogil R812S (BET surface area: 220 $m^2$/g, available from Japan Aerogil Co., Ltd.) Aerogil RX200 (BET surface area: 140 $m^2$/g, available from Japan Aerogil Co., Ltd.)

SYNTHESIS EXAMPLE 1

Preparation of Imide Compound (a) Having Hydroxyl Group at Each Terminal

In a 500 mL-volume glass separable flask equipped with a nitrogen gas inlet, a Dean-Stark receiver, and a cooler were placed 58.8 g (0.20 mol) of 2,3,3',4'-biphenyltetracarboxylic dianhydride, 30 g (0.40 mol) of 3-aminopropanol, and 200 mL of dimethylacetamide. The compounds were stirred at 100° C. for one hour in a nitrogen gas atmosphere. To the mixture was added 50 mL of toluene, and the resulting mixture was heated at 180° C. for 4 hours, while water produced in the course of imidation reaction was removed together with toluene by azeotropic distillation. The reaction mixture was poured into 2 L of water, and the resulting precipitate was collected by filtration, washed with water, and dried under reduced pressure, to obtain 43.16 g of an imide compound in the form of powder. $^1$H-NMR spectrum of the imide compound is shown in FIG. 1. From the $^1$H-NMR spectrum, it is confirmed that the imide compound is an imide compound having hydroxyl group at each terminal (m in formula (3) is 0).

SYNTHESIS EXAMPLE 2

Preparation of Imide Compound (b) Having Hydroxyl Group at Each Terminal

Figure 2:
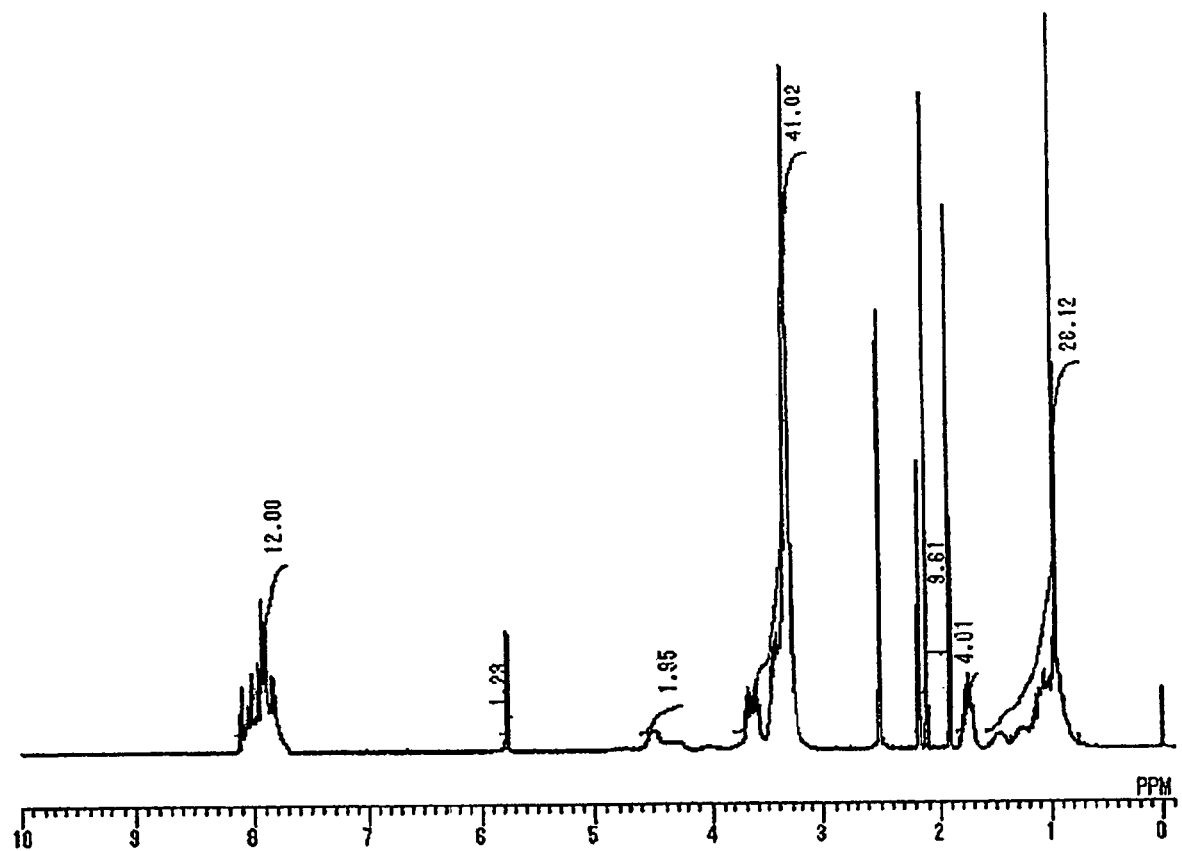
FIG. 2 is $^1$H-NMR spectrum of imide compound (b) having hydroxyl group at each terminal which was obtained in Synthesis Example 2.

In a 500 mL-volume glass separable flask equipped with a nitrogen gas inlet, a Dean-Stark receiver, and a cooler were placed 58.8 g (0.20 mol) of 2,3,3',4'-biphenyltetracarboxylic dianhydride, 17.0 g (0.10 mol) of isophorone diamine, 15.0 g (0.20 mol) of 3-aminopropanol, and 200 mL of dimethylacetamide. The compounds were stirred at 100° C. for one hour in a nitrogen gas atmosphere. To the mixture was added 50 mL of toluene, and the resulting mixture was heated at 180° C. for 4 hours, while water produced in the course of imidation reaction was removed together with toluene by azeotropic distillation. The reaction mixture was poured into 2 L of water, and the resulting precipitate was collected by filtration, washed with water, and dried under reduced pressure, to obtain 78.8 g of an imide compound in the form of powder. $^1$H-NMR spectrum of the imide compound is shown in FIG. 2. From a ratio of integral strength of a peak assignable to 2-position methylene proton of propanol (1.65-1.85 ppm) and a peak assignable to phenylene proton of biphenyltetracarboxylic imide (7.50-8.20 ppm) observed in the $^1$H-NMR spectrum of FIG. 2, it is confirmed that the imide compound is an imide compound having hydroxyl group at each terminal (m in formula (3) is 1 (average)), that is, an imide oligomer having hydroxyl group at each terminal.

SYNTHESIS EXAMPLE 3

Preparation of Imide Compound (c) Having Hydroxyl Group at Each Terminal

Figure 3:
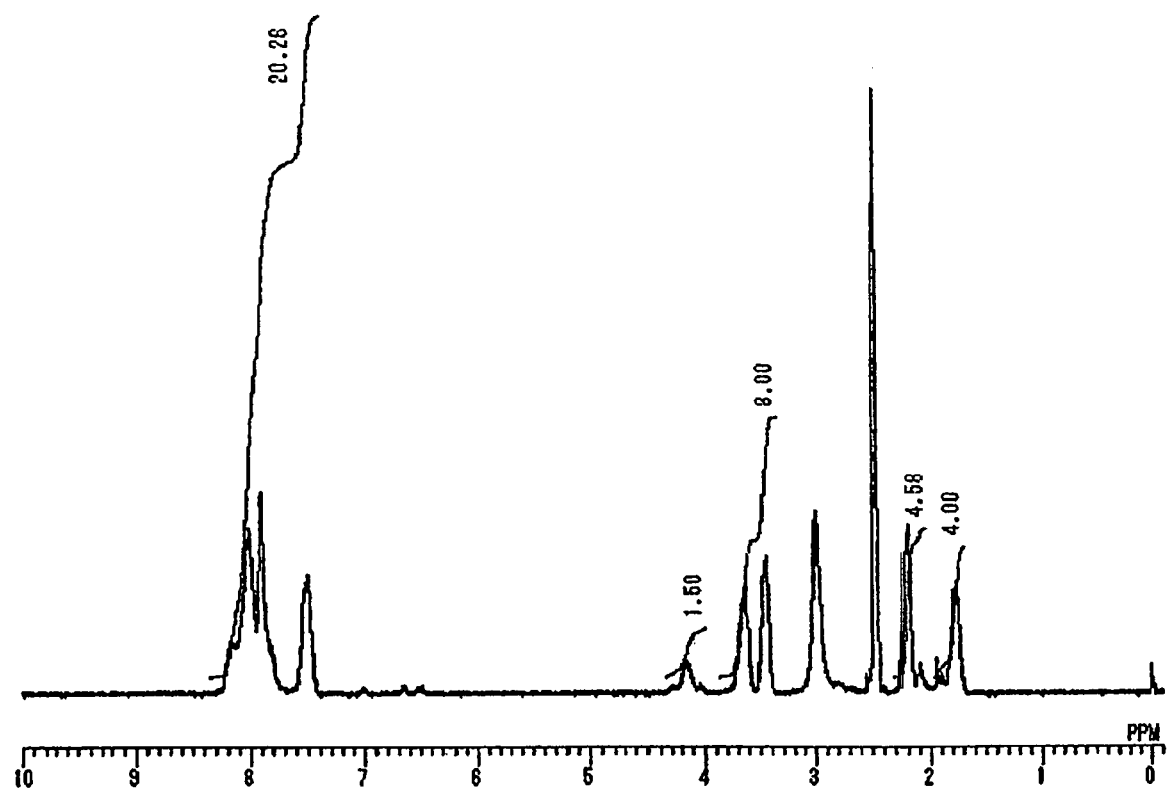
FIG. 3 is $^1$H-NMR spectrum of imide compound (c) having hydroxyl group at each terminal which was obtained in Synthesis Example 3.

In a 500 mL-volume glass separable flask equipped with a nitrogen gas inlet, a Dean-Stark receiver, and a cooler were placed 29.4 g (0.10 mol) of 2,3,3',4'-biphenyltetracarboxylic dianhydride, 7.43 g (0.061 mol) of 2,4-diaminotoluene, 5.89 g (0.078 mol) of 3-aminopropanol, and 100 mL of dimethylacetamide. The compounds were stirred at 100° C. for one hour in a nitrogen gas atmosphere. To the mixture was added 50 mL of toluene, and the resulting mixture was heated at 180° C. for 4 hours, while water produced in the course of imidation reaction was removed together with toluene by azeotropic distillation. The reaction mixture was poured into 2 L of water, and the resulting precipitate was collected by filtration, washed with water, and dried under reduced pressure, to obtain 38.5 g of an imide compound in the form of powder. $^1$H-NMR spectrum of the imide compound is shown in FIG. 3. From a ratio of integral strength of a peak assignable to 2-position methylene proton of propanol (1.65-2.00 ppm) and a peak assignable to phenylene proton of biphenyltetracarboxylic imide (7.35-8.30 ppm) observed in the $^1$H-NMR spectrum of FIG. 3, it is confirmed that the imide compound is an imide compound having hydroxyl group at each terminal (m in formula (3) is 1.6 (average)), that is, an imide oligomer having hydroxyl group at each terminal.

EXAMPLE 1

Preparation of Modified Polyimide Resin

Figure 4:
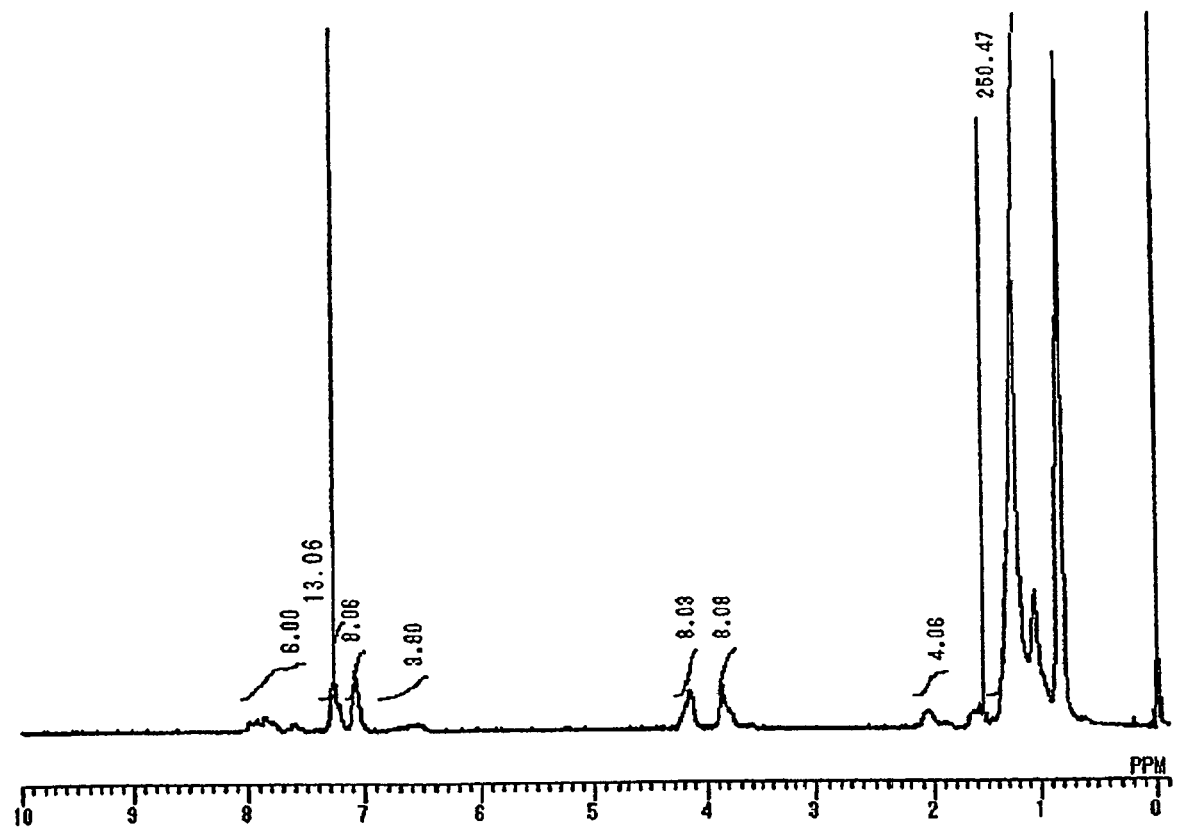
FIG. 4 is $^1$H-NMR spectrum of modified polyimide resin obtained in Example 1.

In a 100 mL-volume glass flask equipped with a nitrogen gas inlet were placed 10 g (6.4 mmol) of GI-1000 (polybutadiene having hydroxyl groups), 3.20 g (12.8 mmol) of 4,4'-diphenylmethane diisocyanate, and 13.2 g of cyclohexanone. The compounds were stirred at 80° C. for 1.5 hours in a nitrogen gas atmosphere. To the mixture were added 2.61 g (6.4 mmol) of the imide compound (a) pre-pared in Synthesis Example 1 and 23.7 g of cyclohexanone. The resulting mixture was then stirred at 80° C. for 1.5 hours. Thus produced polyimide resin solution had a polymer concentration of 40 wt. %, and a solution viscosity of 2.4 Pa·s. The number-average molecular weight of the polyimide resin determined by GPC was 20,400. The $^1$H-NMR spectrum of the polyimide resin is shown in FIG. 4.

EXAMPLE 2

Preparation of Modified Polyimide Resin

Figure 5:
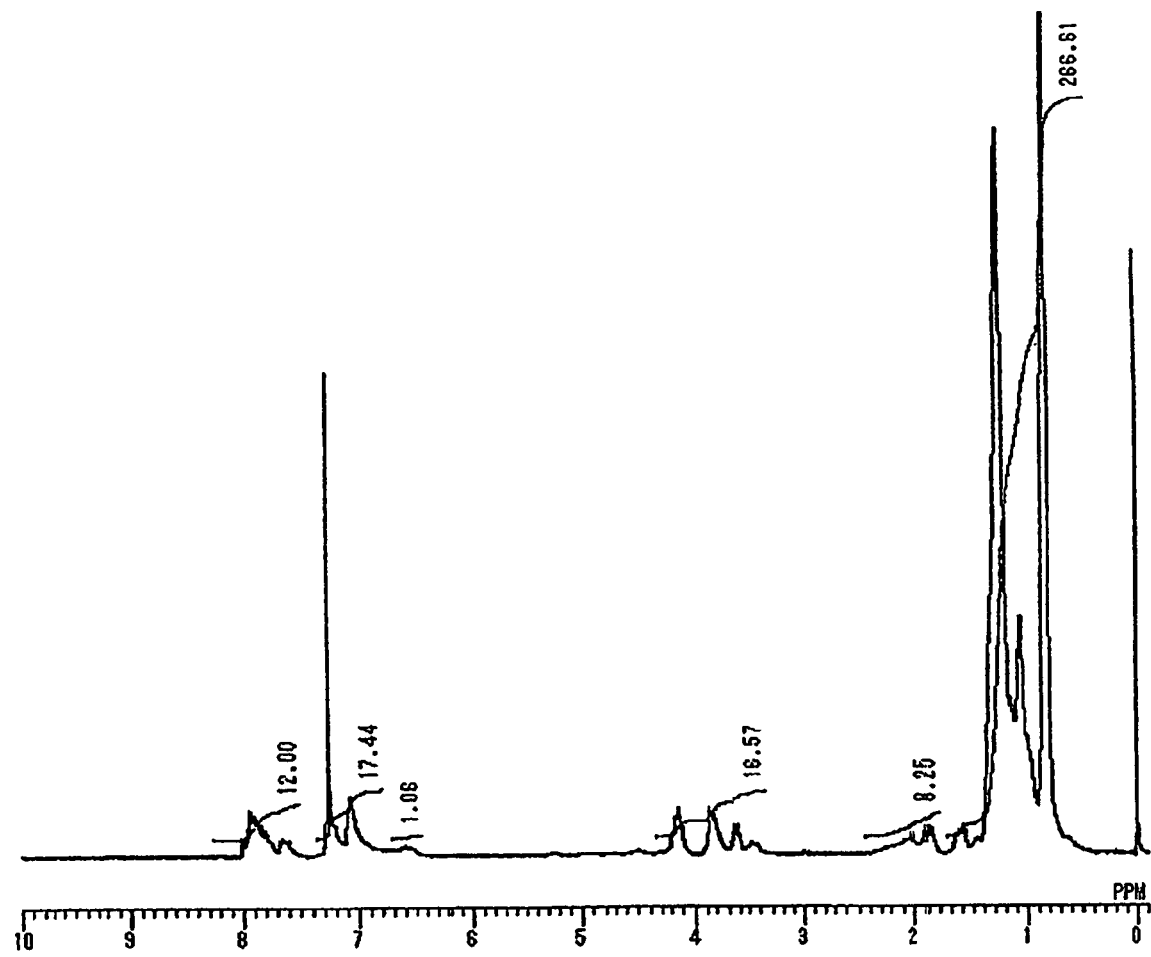
FIG. 5 is $^1$H-NMR spectrum of modified polyimide resin obtained in Example 2.

In a 100 mL-volume glass flask equipped with a nitrogen gas inlet were placed 7.86 g (5.0 mmol) of GI-1000 (polybutadiene having hydroxyl groups), 0.168 g (1.25 mmol) of 2,2-bis(hydroxymethyl)propionic acid, 2.56 g (10.2 mmol) of 4,4'-diphenylmethane diisocyanate, and 10 g of isophorone. The compounds were stirred at 80° C. for 1.5 hours in a nitrogen gas atmosphere. To the mixture were added 4.17 g (5.0 mmol) of the imide compound (b) prepared in Synthesis Example 2 and 12.1 g of isophorone. The resulting mixture was then stirred at 80° C. for 1.5 hours. Thus produced polyimide resin solution had a polymer concentration of 40 wt. %, and a solution viscosity of 6.3 Pa·s. The number-average molecular weight of the polyimide resin determined by GPC was 11,000. The $^1$H-NMR spectrum of the polyimide resin is shown in FIG. 5.

EXAMPLE 3

Preparation of Modified Polyimide Resin

Figure 6:
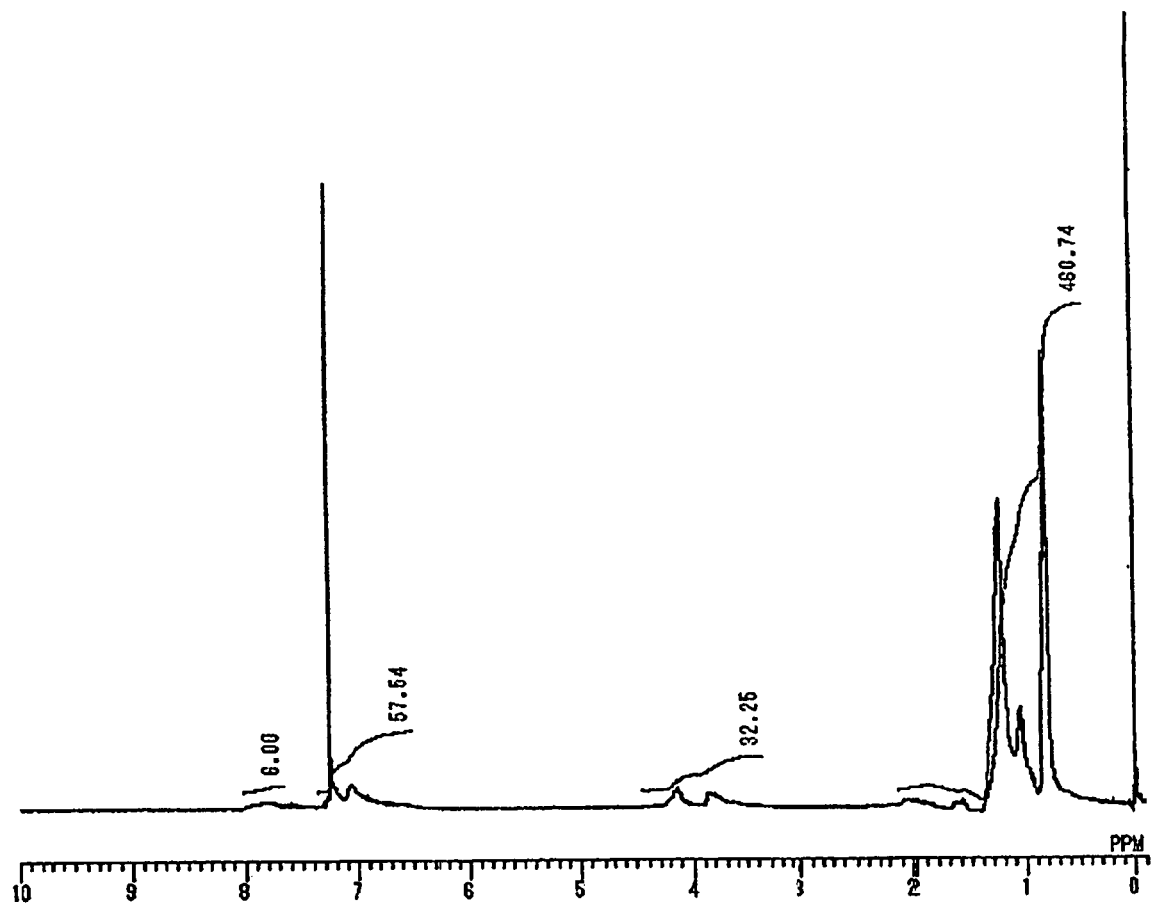
FIG. 6 is $^1$H-NMR spectrum of modified polyimide resin obtained in Example 3.

In a 100 mL-volume glass flask equipped with a nitrogen gas inlet were placed 15.71 g (10.0 mmol) of GI-1000 (polybutadiene having hydroxyl groups), 1.34 g (10.0 mmol) of 2,2-bis(hydroxymethyl)propionic acid, 10.01 g (40.0 mmol) of 4,4'-diphenylmethane diisocyanate, and 27.1 g of isophorone. The compounds were stirred at 80° C. for 1.5 hours in a nitrogen gas atmosphere. To the mixture were added 8.16 g (20.0 mmol) of the imide compound (a) prepared in Synthesis Example 1 and 25.8 g of isophorone. The resulting mixture was then stirred at 80° C. for 1.5 hours. Thus produced polyimide resin solution had a polymer concentration of 40 wt. %, and a solution viscosity of 190 Pa·s. The number-average molecular weight of the polyimide resin determined by GPC was 20,500. The $^1$H-NMR spectrum of the polyimide resin is shown in FIG. 6.

EXAMPLE 4

Preparation of Modified Polyimide Resin

Figure 7:
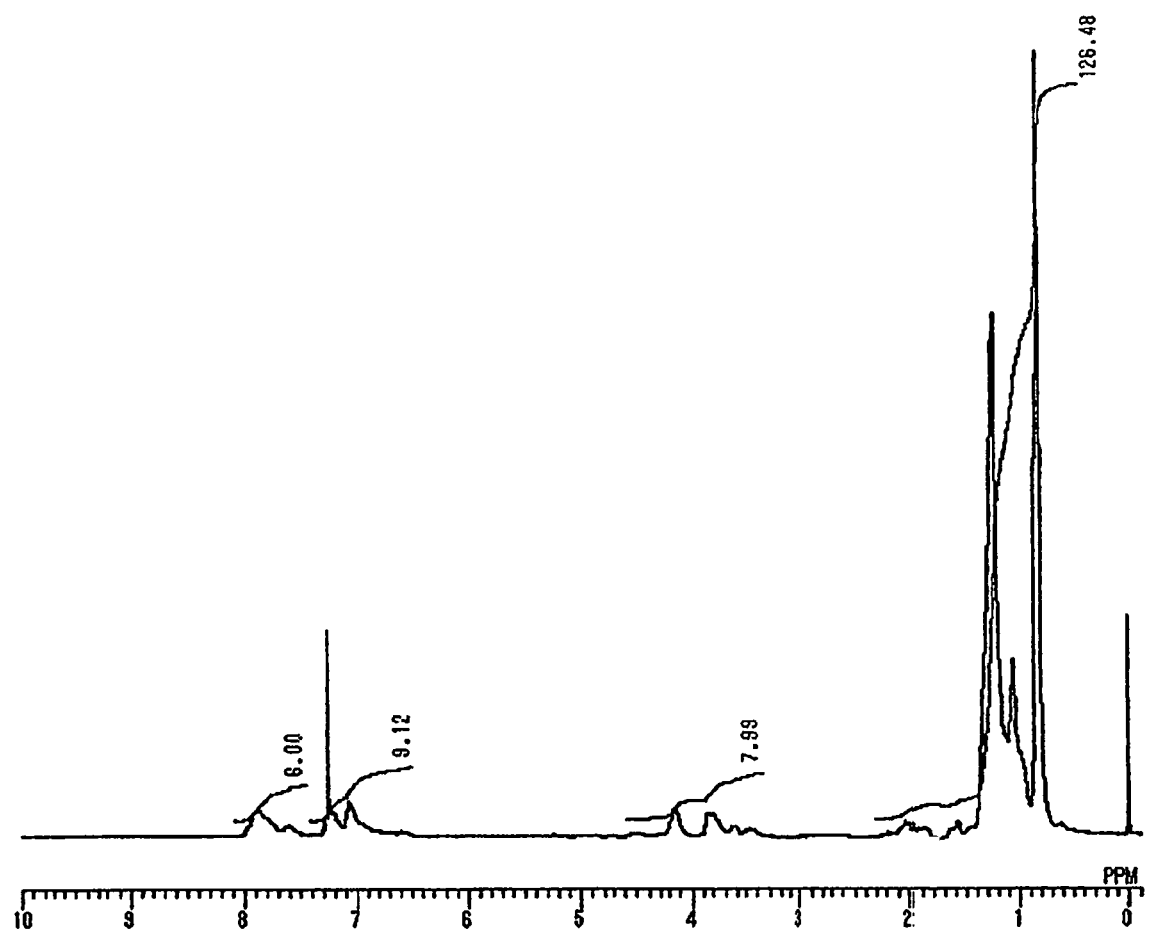
FIG. 7 is $^1$H-NMR spectrum of modified polyimide resin obtained in Example 4.

In a 100 mL-volume glass flask equipped with a nitrogen gas inlet were placed 11.0 g (5.0 mmol) of GI-2000 (polybutadiene having hydroxyl groups), 0.335 g (2.50 mmol) of 2,2-bis(hydroxymethyl)propionic acid, 3.33 g (13.3 mmol) of 4,4'-diphenylmethane diisocyanate, and 10 g of isophorone. The compounds were stirred at 80° C. for 1.5 hours in a nitrogen gas atmosphere. To the mixture were added 6.26 g (7.5 mmol) of the imide compound (b) prepared in Synthesis Example 2 and 21.4 g of isophorone. The resulting mixture was then stirred at 80° C. for 1.5 hours. Thus produced polyimide resin solution had a polymer concentration of 40 wt. %, and a solution viscosity of 5.5 Pa·s. The number-average molecular weight of the polyimide resin determined by GPC was 7,400. The $^1$H-NMR spectrum of the polyimide resin is shown in FIG. 7.

EXAMPLE 5

Preparation of Modified Polyimide Resin

Figure 8:
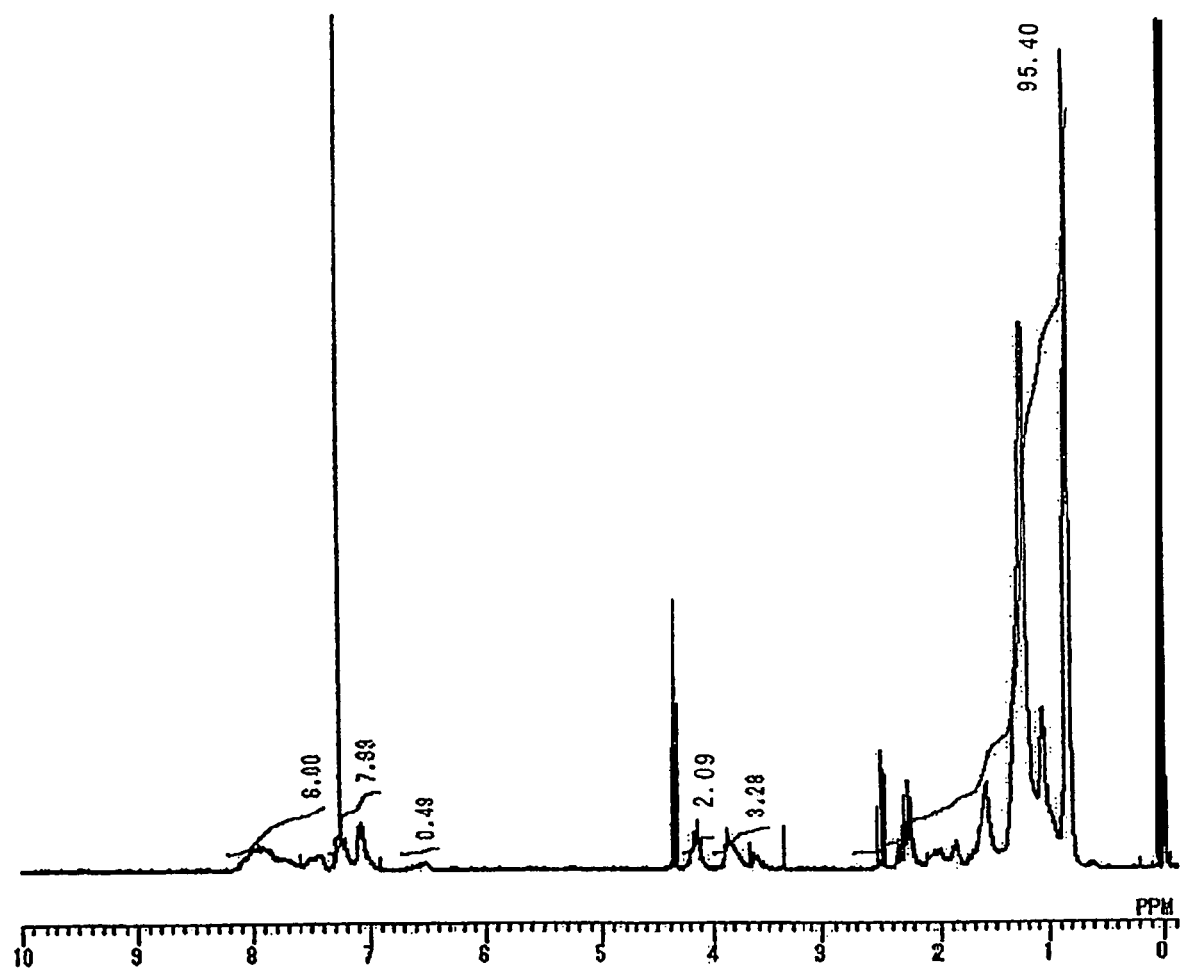
FIG. 8 is $^1$H-NMR spectrum of modified polyimide resin obtained in Example 5.

In a 100 mL-volume glass flask equipped with a nitrogen gas inlet were placed 10.0 g (6.4 mmol) of GI-1000 (polybutadiene having hydroxyl groups) and 3.20 g (12.8 mmol) of 4,4'-diphenylmethane diisocyanate. The compounds were stirred at 80° C. for 1.5 hours in a nitrogen gas atmosphere. To the mixture were added 6.46 g (6.4 mmol) of the imide compound (c) prepared in Synthesis Example 3 and 29.5 g of γ-butyrolactone. The resulting mixture was then stirred at 80° C. for 1.5 hours. Thus produced polyimide resin solution had a polymer concentration of 40 wt. %, and a solution viscosity of 1.7 Pa·s. The number-average molecular weight of the polyimide resin determined by GPC was 6,300. The $^1$H-NMR spectrum of the polyimide resin is shown in FIG. 8.

EXAMPLE 6

Preparation of Polyimide Resin Composition

In a glass vessel were placed the polyimide resin solution obtained in Example 1, 10 weight parts (per 100 weight parts of the polyimide resin) of Epikote 157S70 (epoxy resin), and 0.4 weight parts of 2E4MZ (amine curing agent). The compounds were stirred and uniformly mixed to give the desired polyimide resin composition.

The resulting polyimide resin composition was evaluated in terms of modulus in tension, bendability, adhesion to molding material, resistance to soldering, resistance to solvents, and electric insulation property, in the aforementioned manners. The results are set forth in Table 2.

EXAMPLES 7 TO 20

Preparation of Polyimide Resin Composition

The procedures of Example 6 were repeated except that the compounds in the amounts designated in Table 1 were employed for preparing polyimide resin compositions.

The resulting polyimide resin compositions were evaluated in terms of modulus in tension, bendability, adhesion to molding material, resistance to soldering, resistance to solvents, and electric insulation property, in the aforementioned manners. The results are set forth in Table 2.

EXAMPLE 21

In a glass vessel were placed the polyimide resin solution obtained in Example 2, 10 weight parts (per 100 weight parts of the polyimide resin in the polyimide resin solution) of EPOLEAD PB3600 (epoxy resin), 20 weight parts of BARNOCK D-550 (polyvalent isocyanate), 2.5 weight parts of KURARAY POLYOL C-2015 (polycarbonate diol), 0.8 weight part of 2E4MZ (amine curing agent), and 20 weight parts of Aerogil R972 (silica micro powder). The compounds were stirred and uniformly mixed to give a polyimide resin composition.

Thus obtained polyimide resin composition was evaluated in terms of modulus in tension, bendability, adhesion to molding material, resistance to soldering, and resistance to solvents, in the aforementioned manners. The results are set forth in Table 2.

EXAMPLE 22

In a glass vessel were placed the polyimide resin solution obtained in Example 2, 10 weight parts (per 100 weight parts of the polyimide resin in the polyimide resin solution) of EPOLEAD PB3600 (epoxy resin), 20 weight parts of BARNOCK D-550 (polyvalent isocyanate), 2.5 weight parts of ETHANACOL UH-CARB200 (polycarbonate diol), 2.5 wt parts of H-1 (compound having phenolic hydroxyl group), 0.8 weight part of 2E4MZ (amine curing agent), and 20 weight parts of Aerogil R972 (silica micro powder). The compounds were stirred and uniformly mixed to give a polyimide resin composition.

Thus obtained polyimide resin composition was evaluated in terms of modulus in tension, bendability, adhesion to molding material, resistance to soldering, and resistance to solvents, in the aforementioned manners. The results are set forth in Table 2.

COMPARISON EXAMPLE 1

Preparation of Polyimide Resin and Polyimide Resin Composition

In a 300 ml-volume separable glass flask equipped with a nitrogen gas inlet were placed 40.0 g (25.5 mmol) of GI-1000 (polybutadiene having hydroxyl groups) and 12.8 g (51.0 mmol) of 4,4'-diphenylmethane diisocyanate. The compounds were stirred at 120° C. for 1.5 hours in a nitrogen gas atmosphere. To the mixture were added 7.50 g (25.5 mmol) of 2,3,3',4'-biphenyltetracarboxylic dianhydride and 87.1 g of cyclohexanone. The resulting mixture was then stirred at 180° C. for 4 hours. Thus produced polyimide resin solution had a polymer concentration of 40 wt. %, and a solution viscosity of 130 Pa·s. The number-average molecular weight of the polyimide resin determined by GPC was 9,400.

The procedures of Example 6 were repeated except that the modified polyimide resin was replaced with the polyimide resin obtained above.

The resulting polyimide resin composition was evaluated in terms of modulus in tension, bendability, adhesion to molding material, resistance to soldering, resistance to solvents, and electric insulation property, in the aforementioned manners. The results are set forth in Table 2.

TABLE 1

| Example | Polyimide resin | Epoxy Resin | | Curing agent | Silica micro powder | |
|---|---|---|---|---|---|---|
| Ex. 6 | Ex. 1 (100) | 157S70 | (10) | 2E4MZ (0.4) | — | |
| Ex. 7 | Ex. 2 (100) | 157S70 | (10) | 2E4MZ (0.4) | — | |
| Ex. 8 | Ex. 3 (100) | 157S70 | (10) | 2E4MZ (0.4) | — | |
| Ex. 9 | Ex. 4 (100) | 157S70 | (10) | 2E4MZ (0.4) | — | |
| Ex. 10 | Ex. 5 (100) | 157S70 | (10) | 2E4MZ (0.4) | — | |
| Ex. 11 | Ex. 2 (100) | 157S70 | (10) | 2E4MZ (0.4) | 130 | (20) |
| Ex. 12 | Ex. 2 (100) | 157S70 | (10) | 2E4MZ (0.4) | R972 | (20) |
| Ex. 13 | Ex. 2 (100) | PB3600 | (10) | 2E4MZ (0.4) | R972 | (20) |

TABLE 1-continued

| Example | Polyimide resin | Epoxy Resin | | Curing agent | | Silica micro powder | |
|---|---|---|---|---|---|---|---|
| Ex. 14 | Ex. 2 (100) | E-1000-8 | (10) | 2E4MZ | (0.4) | R972 | (20) |
| Ex. 15 | Ex. 2 (100) | EHPE | | 2E4MZ | (0.4) | R972 | (20) |
| Ex. 16 | Ex. 2 (100) | ELM100 | | 2E4MZ | (0.4) | R972 | (20) |
| Ex. 17 | Ex. 2 (100) | E-1000-8 | (10) | 2E4MZ | (0.4) | R974 | (20) |
| Ex. 18 | Ex. 2 (100) | E-1000-8 | (10) | 2E4MZ | (0.4) | R805 | (20) |
| Ex. 19 | Ex. 2 (100) | E-1000-8 | (10) | 2E4MZ | (0.4) | R812S | (20) |
| Ex. 20 | Ex. 2 (100) | E-1000-8 | (10) | 2E4MZ | (0.4) | RX200 | (20) |

Remarks: the amount is indicated in terms of weight part(s)

TABLE 2

| Example | Viscosity (Pa · s) | Modulus of elasticity | Bendability | Adhesion | Resistance to solder/solvent |
|---|---|---|---|---|---|
| Ex. 6 | 4.1 | 14 | good | pass | pass/>50 |
| Ex. 7 | 6.8 | 30 | good | pass | pass/>50 |
| Ex. 8 | 220 | 231 | good | pass | good/>50 |
| Ex. 9 | 22 | 19 | good | pass | pass/>50 |
| Ex. 10 | 3.8 | 246 | good | pass | pass/>50 |
| Ex. 11 | 24 | 87 | good | pass | good/23 |
| Ex. 12 | 21 | 120 | good | pass | good/32 |
| Ex. 13 | 17 | 110 | good | pass | good/>50 |
| Ex. 14 | 14 | 140 | good | pass | good/35 |
| Ex. 15 | 21 | 130 | good | pass | good/30 |
| Ex. 16 | 19 | 90 | good | pass | good/24 |
| Ex. 17 | 21 | 152 | good | pass | good/35 |
| Ex. 18 | 17 | 152 | good | pass | good/20 |
| Ex. 19 | 21 | 164 | good | pass | good/31 |
| Ex. 20 | 20 | 182 | good | pass | pass/24 |
| Ex. 21 | 40 | 155 | good | pass | good/>50 |
| Ex. 22 | 35 | 189 | good | pass | good/>50 |
| Com. 1 | 148 | 8 | good | poor | failure/>50 |

Volume resistance (Ω · cm)
$1.3 \times 10^{15}$ for Example 7
$1.3 \times 10^{16}$ for Example 8
$1.0 \times 10^{14}$ for Example 9
$8.0 \times 10^{13}$ for Example 14

The invention claimed is:

1. A polyimide resin comprising the following recurring units (I) and (II):

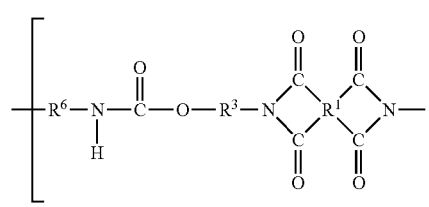

(I)

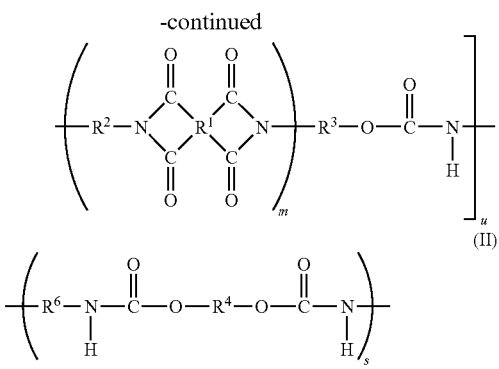

in which $R^1$ is a tetravalent residue obtained by removing all carboxyl groups from an organic compound having 4 carboxyl groups; each of $R^2$ and $R^3$ independently is a divalent hydrocarbon group; $R^4$ is a divalent polybutadiene unit; and $R^6$ is a divalent residue obtained by removing all isocyanate groups from an organic compound having 2 isocyanate groups; m is an integer of 1 to 20; and each of s and u independently is an integer of 1 to 100.

2. The polyimide resin of claim 1, in which $R^1$ is a tetravalent residue obtained from a tetracarboxylic acid compound selected from the group consisting of 2,3,3',4'-biphenyltetracarboxylic acid, 3,3',4,4'-diphenylethertetracarboxylic acid, 2,2',3,3'-biphenyltetracarboxylic acid, 2,3,3',4'-biphenyltetracarboxylic acid dianhydride, 3,3',4,4'-diphenylethertetracarboxylic acid dianhydride, 2,2',3,3'-biphenyltetracarboxylic acid dianhydride, an ester of 2,3,3',4'-biphenyltetracarboxylic acid, an ester of 3,3',4,4'-diphenylethertetracarboxylic acid, and an ester of 2,2',3,3'-biphenyltetracarboxylic acid.

3. The polyimide resin of claim 1, in which $R^2$ is an alicyclic group having 4 to 20 carbon atoms.

4. The polyimide resin of claim 1, in which $R^3$ is an aliphatic hydrocarbon group having 1 to 10 carbon atoms.

5. The polyimide resin of claim 1, in which $R^4$ is a divalent polybutadiene unit having a number average molecular weight in the range of 500 to 10,000.

6. The polyimide resin of claim 1, in which $R^6$ is a divalent hydrocarbon group selected from the group consisting of a divalent aliphatic group, a divalent alicyclic group, a divalent aromatic group, and combinations thereof.

7. A polyimide resin comprising the following recurring units (I), (II), and (III):

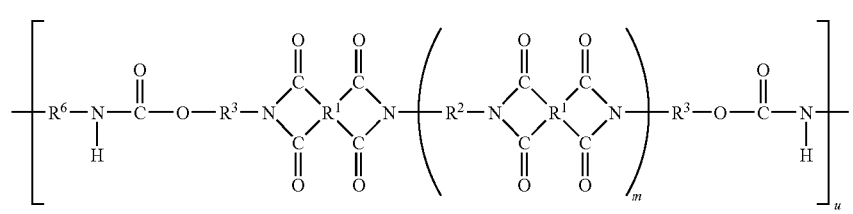

(I)

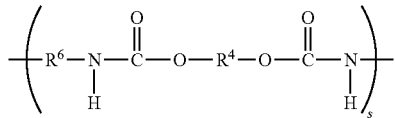

(II)

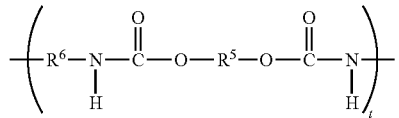

(III)

in which $R^1$ is a tetravalent residue obtained by removing all carboxyl groups from an organic compound having 4 carboxyl groups; each of $R^2$ and $R^3$ independently is a divalent hydrocarbon group; $R^4$ is a divalent polybutadiene unit; and $R^5$ is a divalent hydrocarbon group having a reactive substituent; $R^6$ is a divalent residue obtained by removing all isocyanate groups from an organic compound having 2 isocyanate groups; m is an integer of 1 to 20; and each of s, t and u independently is an integer of 1 to 100.

8. The polyimide resin of claim 7, in which $R^1$ is a tetravalent residue obtained from a tetracarboxylic acid compound selected from the group consisting of 2,3,3',4'-biphenyltetracarboxylic acid, 3,3',4,4'-diphenylethertetracarboxylic acid, 2,2',3,3'-biphenyltetracarboxylic acid, 2,3,3',4'-biphenyltetracarboxylic acid dianhydride, 3,3',4,4'-diphenylethertetracarboxylic acid dianhydride, 2,2',3,3'-biphenyltetracarboxylic acid dianhydride, an ester of 2,3,3',4'-biphenyltetracarboxylic acid, an ester of 3,3',4,4'-diphenylethertetracarboxylic acid, and an ester of 2,2',3,3'-biphenyltetracarboxylic acid.

9. The polyimide resin of claim 7, in which $R^2$ is an alicyclic group having 4 to 20 carbon atoms.

10. The polyimide resin of claim 7, in which $R^3$ is an aliphatic hydrocarbon group having 1 to 10 carbon atoms.

11. The polyimide resin of claim 7, in which $R^4$ is a divalent polybutadiene unit having a number average molecular weight in the range of 500 to 10,000.

12. The polyimide resin of claim 7, in which $R^5$ is a divalent hydrocarbon group having a carboxyl group.

13. The polyimide resin of claim 7, in which $R^6$ is a divalent hydrocarbon group selected from the group consisting of a divalent aliphatic group, a divalent alicyclic group, a divalent aromatic group, and combinations thereof.

14. A method for preparing the polyimide resin of claim 1 which comprises reacting a diisocyanate compound having the formula (1), a polybutadiene compound having the formula (2), and an imide compound having the formula (3):

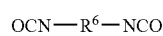

(1)

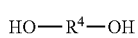

(2)

(3)

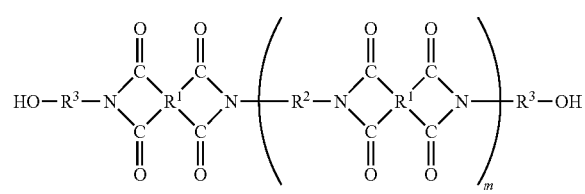

in which $R^1$ is a tetravalent residue obtained by removing all carboxyl groups from an organic compound having 4 carboxyl groups; each of $R^2$ and $R^3$ independently is a divalent hydrocarbon group; $R^4$ is a divalent polybutadiene unit; and $R^6$ is a divalent residue obtained by removing all isocyanate groups from an organic compound having 2 isocyanate groups; m is an integer of 1 to 20.

15. A method for preparing the polyimide resin of claim 7 which comprises reacting a diisocyanate compound having the formula (1), a polybutadiene compound having the formula (2), a divalent compound having the formula (4), and an imide compound having the formula (3):

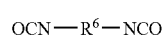

(1)

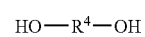

(2)

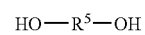

(4)

(3)

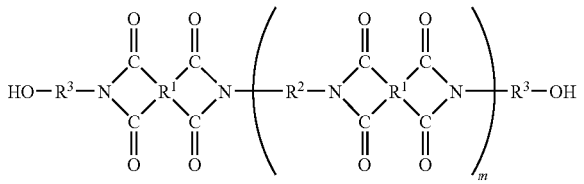

in which $R^1$ is a tetravalent residue obtained by removing all carboxyl groups from an organic compound having 4 carboxyl groups; each of $R^2$ and $R^3$ independently is a divalent hydrocarbon group; $R^4$ is a divalent polybutadiene unit; and $R^5$ is a divalent hydrocarbon group having a reactive substituent; $R^6$ is a divalent residue obtained by removing all isocyanate groups from an organic compound having 2 isocyanate groups; m is an integer of 1 to 20.

16. A method for preparing the polyimide resin of claim 7 which comprises reacting a divalent isocyanate compound having the formula (5) and an imide compound having the formula (3):

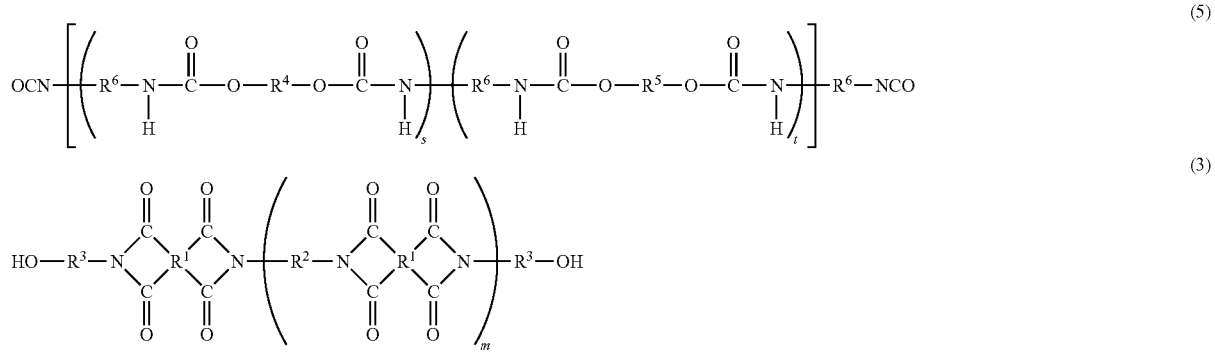

(5)

(3)

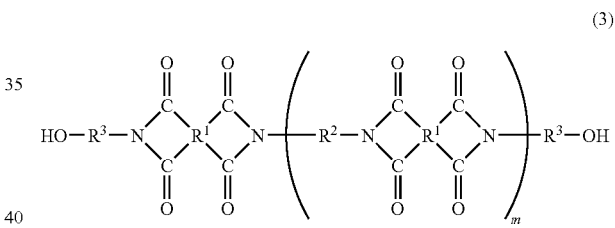

in which $R^1$ is a tetravalent residue obtained by removing all carboxyl groups from an organic compound having 4 carboxyl groups; each of $R^2$ and $R^3$ independently is a divalent hydrocarbon group; $R^4$ is a divalent polybutadiene unit; and $R^5$ is a divalent hydrocarbon group having a reactive substituent; $R^6$ is a divalent residue obtained by removing all isocyanate groups from an organic compound having 2 isocyanate groups; m is an integer of 1 to 20; and each of s and t independently is an integer of 1 to 100.

17. A curable polyimide resin composition comprising 100 weight parts of a polyimide resin of claim 1, 1 to 50 weight parts of an epoxy group, and an organic solvent.

18. The curable polyimide resin composition of claim 17, which further comprises a blocked polyvalent isocyanate compound.

19. The curable polyimide resin composition of claim 17, which further comprises a polycarbonate compound having a hydroxyl group at each terminal.

20. The curable polyimide resin composition of claim 17, which further comprises a compound having a phenolic hydroxyl group.

21. A curable polyimide resin composition comprising 100 weight parts of a polyimide resin of claim 7, 1 to 50 weight parts of an epoxy group, and an organic solvent.

22. The curable polyimide resin composition of claim 21, which further comprises a blocked polyvalent isocyanate compound.

23. The curable polyimide resin composition of claim 21, which further comprises a polycarbonate compound having a hydroxyl group at each terminal.

24. The curable polyimide resin composition of claim 21, which further comprises a compound having a phenolic hydroxyl group.

25. A process for preparing a cured resin film which comprises the steps of coating a curable polyimide resin composition of claim 17 on a substrate and heating the coated composition.

26. A process for preparing a cured resin film which comprises the steps of coating a curable polyimide resin composition of claim 21 on a substrate and heating the coated composition.

27. An imide oligomer having the following formula (3):

(3)

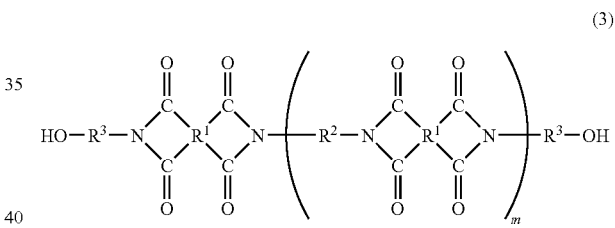

in which $R^1$ is a tetravalent residue obtained by removing all carboxyl groups from an organic compound having 4 carboxyl groups; $R^2$ is a divalent alicyclic hydrocarbon group having 4 to 20 carbon atoms; $R^3$ is a divalent aliphatic hydrocarbon group having 1 to 10 carbon atoms; and m is an integer of 1 to 20.

* * * * *